(12) United States Patent
Hatakeyama et al.

(10) Patent No.: US 9,658,530 B2
(45) Date of Patent: May 23, 2017

(54) PROCESS FOR FORMING MULTI-LAYER FILM AND PATTERNING PROCESS

(71) Applicant: SHIN-ETSU CHEMICAL CO., LTD., Tokyo (JP)

(72) Inventors: Jun Hatakeyama, Jyoetsu (JP); Takeshi Nagata, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 21 days.

(21) Appl. No.: 14/742,358

(22) Filed: Jun. 17, 2015

(65) Prior Publication Data

US 2016/0008844 A1  Jan. 14, 2016

(30) Foreign Application Priority Data

Jul. 8, 2014  (JP) .................................. 2014-140110

(51) Int. Cl.
*H01L 21/302* (2006.01)
*H01L 21/461* (2006.01)
(Continued)

(52) U.S. Cl.
CPC .............. *G03F 7/094* (2013.01); *G03F 7/091* (2013.01); *H01L 21/027* (2013.01);
(Continued)

(58) Field of Classification Search
None
See application file for complete search history.

(56) References Cited

U.S. PATENT DOCUMENTS

2004/0241577 A1  12/2004  Hatakeyama et al.
2004/0259037 A1  12/2004  Hatakeyama et al.
(Continued)

FOREIGN PATENT DOCUMENTS

JP  2004-205658 A  7/2004
JP  2004-205676 A  7/2004
(Continued)

OTHER PUBLICATIONS

Tom Lynch et al., "Properties and Performance of Near UV Reflectivity Control Layers," 1994, vol. 2195, pp. 225-229.
(Continued)

*Primary Examiner* — Stephanie Duclair
(74) *Attorney, Agent, or Firm* — Aaron L. Webb

(57) ABSTRACT

The invention provides a process for forming a multi-layer film including the steps of: (1) forming an under layer film onto a substrate by coating an under layer film material containing a resin represented by the following general formula (1) in which a compound having a bisnaphthol group has been made a novolac resin, and curing the same by heat treatment at a temperature in a range of 300° C. or higher and 700° C. or lower for 10 seconds to 600 seconds, (2) forming a silicon film onto the under layer film, (3) forming a hydrocarbon film onto the silicon film by coating a hydrocarbon film material, and (4) forming a silicon-oxidized film onto the hydrocarbon film by coating a silicon-oxidized film material. There can be provided a process for forming a multi-layer film which can reduce reflectance, and useful for a patterning process with high dimensional accuracy of dry etching.

(Continued)

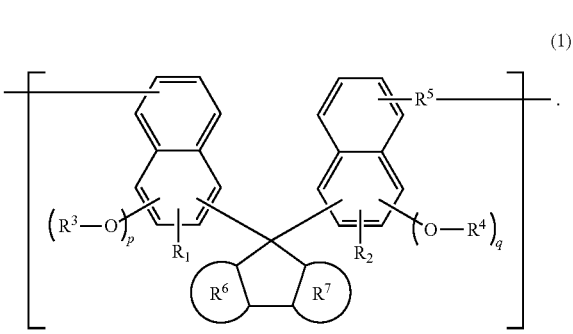

(1)

11 Claims, 6 Drawing Sheets

(51) Int. Cl.
*B44C 1/22* (2006.01)
*C03C 15/00* (2006.01)
*C03C 25/68* (2006.01)
*C23F 1/00* (2006.01)
*G03F 7/09* (2006.01)
*H01L 21/027* (2006.01)
*H01L 21/033* (2006.01)
*B81C 1/00* (2006.01)
*H01L 21/311* (2006.01)
*H01L 21/3213* (2006.01)

(52) U.S. Cl.
CPC .... *H01L 21/0332* (2013.01); *H01L 21/31144* (2013.01); *B81C 1/00031* (2013.01); *H01L 21/31116* (2013.01); *H01L 21/31122* (2013.01); *H01L 21/31138* (2013.01); *H01L 21/32137* (2013.01); *H05K 2203/05* (2013.01)

(56) References Cited

U.S. PATENT DOCUMENTS

| | | |
|---|---|---|
| 2006/0014106 A1 | 1/2006 | Hatakeyama et al. |
| 2006/0019195 A1 | 1/2006 | Hatakeyama et al. |
| 2006/0204891 A1 | 9/2006 | Hatakeyama |
| 2007/0122740 A1 | 5/2007 | Hatakeyama et al. |
| 2007/0238300 A1 | 10/2007 | Ogihara et al. |
| 2007/0275325 A1 | 11/2007 | Hatakeyama et al. |
| 2008/0118860 A1 | 5/2008 | Harada et al. |
| 2009/0081879 A1* | 3/2009 | Sukekawa ......... H01L 21/31116 438/735 |
| 2010/0099044 A1 | 4/2010 | Hatakeyama et al. |
| 2010/0327412 A1* | 12/2010 | Lee ..................... H01L 21/0337 257/618 |
| 2010/0327413 A1* | 12/2010 | Lee ..................... H01L 21/31144 257/618 |
| 2011/0311920 A1 | 12/2011 | Kinsho et al. |
| 2012/0077345 A1 | 3/2012 | Saito et al. |
| 2013/0087529 A1 | 4/2013 | Hatakeyama et al. |

FOREIGN PATENT DOCUMENTS

| | | |
|---|---|---|
| JP | 2004-205685 A | 7/2004 |
| JP | 2004-354554 A | 12/2004 |
| JP | 2005-010431 A | 1/2005 |
| JP | 2005-128509 A | 5/2005 |
| JP | 2005-250434 A | 9/2005 |
| JP | 2006-053543 A | 2/2006 |
| JP | 2006-227391 A | 8/2006 |
| JP | 2006-259249 A | 9/2006 |
| JP | 2006-259482 A | 9/2006 |
| JP | 2006-285095 A | 10/2006 |
| JP | 2006-293298 A | 10/2006 |
| JP | 2007-171895 A | 7/2007 |
| JP | 2007-199653 A | 8/2007 |
| JP | 2007-302873 A | 11/2007 |
| JP | 2007-316282 A | 12/2007 |
| JP | 2008-026600 A | 2/2008 |
| JP | 2008-096684 A | 4/2008 |
| JP | 2008-111103 A | 5/2008 |
| JP | 5336309 B2 | 11/2013 |
| TW | 201030470 A1 | 8/2010 |
| WO | 2010/147155 A1 | 12/2010 |

OTHER PUBLICATIONS

Jan. 27, 2016 Office Action issued in Taiwanese Patent Application No. 104121786.

* cited by examiner

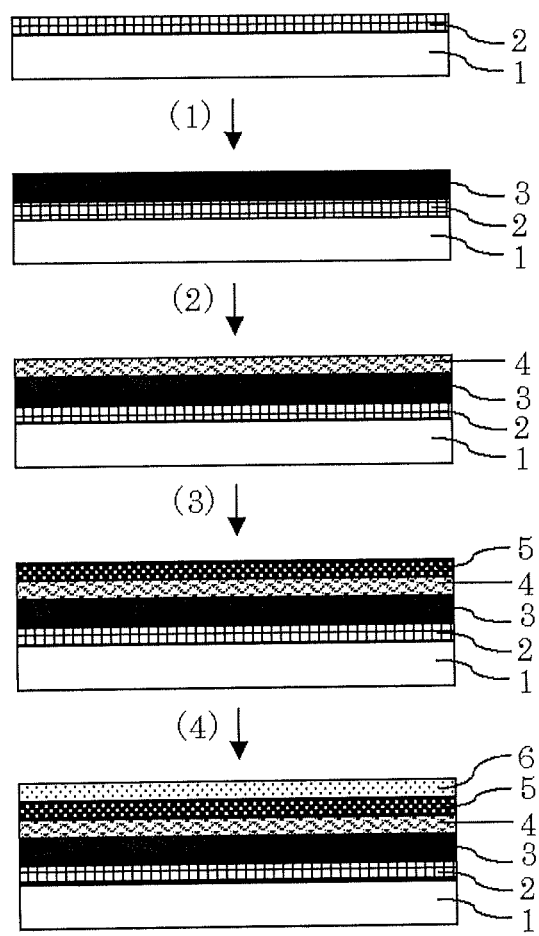

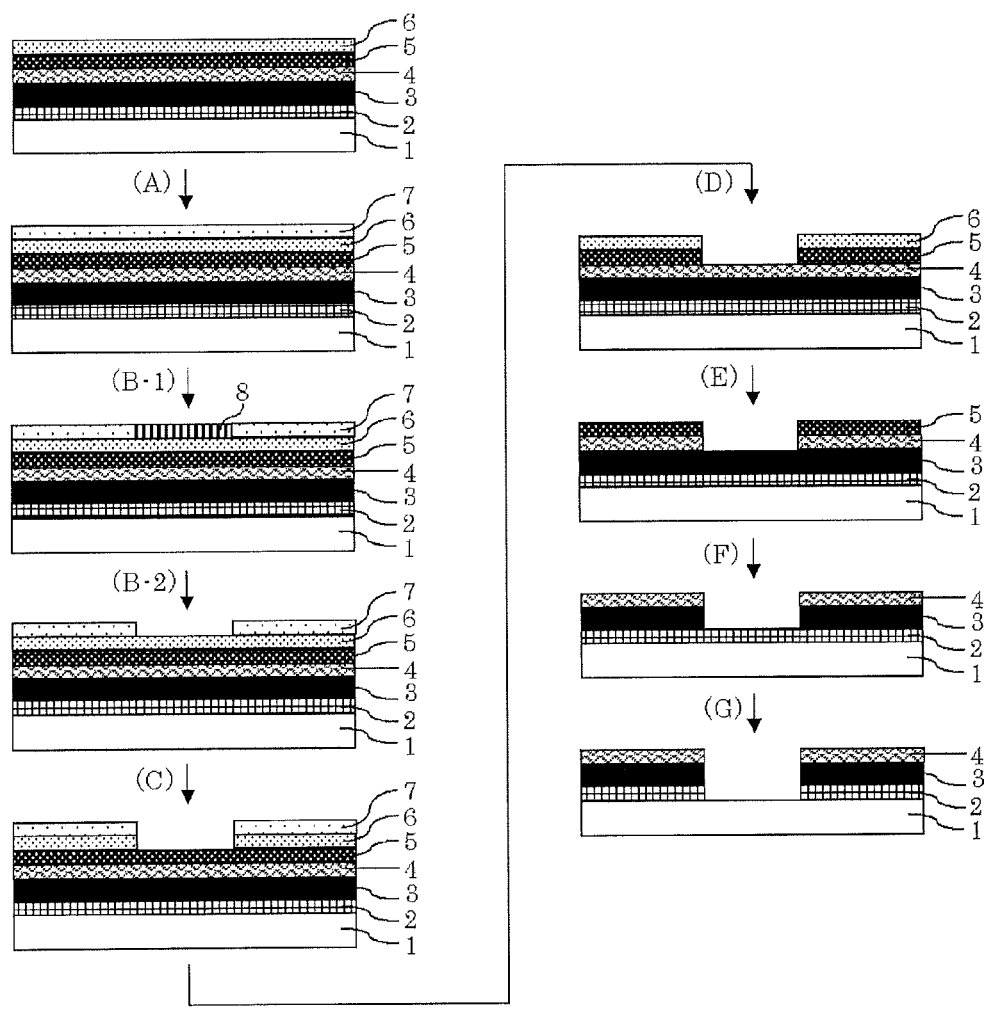

PENTA-LAYER: RESIST FILM/SILICON-OXIDIZED FILM (n=1.6,k=0.2)/
HYDROCARBON FILM (n=1.5, k=0.3)/POLYSILICON FILM (10nm)/
UNDER LAYER FILM (n=1.4, k=0.4; 100nm)

PENTA-LAYER: RESIST FILM/SILICON-OXIDIZED FILM (n=1.6,k=0.2)/
HYDROCARBON FILM (n=1.7, k=0.3)/POLYSILICON FILM (10nm)/
UNDER LAYER FILM (n=1.4, k=0.4; 100nm)

PROCESS FOR FORMING MULTI-LAYER FILM AND PATTERNING PROCESS

BACKGROUND OF THE INVENTION

Field of the Invention

The present invention relates to a process for forming a multi-layer film useful as a resist under layer film to be used for fine processing in the manufacturing process of a semiconductor device, etc., and a patterning process using the multi-layer film formed by the process for forming a multi-layer film.

Description of the Related Art

In recent years, miniaturization of a pattern rule is in progress with a tendency of high integration and high-speed of LSI (Large-Scale Integrated circuit). While miniaturization of a pattern rule is progressing, in the lithography using a light exposure which has been currently used as a general technology, it is approaching the essential limit of resolution derived from a wavelength of a light source.

As a light source for lithography to be used for formation of a resist pattern, g-beam (436 nm) or i-beam (365 nm) of a mercury lamp, KrF excimer laser (248 nm), ArF excimer laser (193 nm), etc., has been widely used, and a double patterning has been investigated for further miniaturization.

The double patterning is a technology which is capable of doubling the resolution of the resist, and miniaturization of the device has been further accelerated thereby. Accompanying with the progress of miniaturization, a dry etching technology and a hard mask material each having high dimensional accuracy have been required. Also, needs for forming deep holes or grooves by dry etching has been heightened in manufacturing a three dimensional NAND memory or a capacitor of DRAM (Dynamic Random-Access Memory), etc. Under such a background, a hard mask excellent in etching resistance has been earnestly required.

On the other hand, to prevent from pattern collapse due to shrinkage of a size of the resist pattern, a thickness of the resist film has been made thin, and as a means to prevent from lowering in dry etching resistance due to thinning of the film, a multi-layer resist process has been used. The multi-layer process generally used in this case is a 3 layer (tri-layer) process in which a hydrocarbon film (hydrocarbon under layer film) is formed at a lower layer, an intermediate film (silicon-containing intermediate film) containing silicon is formed thereon, and a resist film is formed thereon. By providing antireflection effects to both of the silicon-containing intermediate film and the hydrocarbon under layer film, a highly antireflection effect can be obtained. In the age of a liquid immersion lithography in combination with a high NA (Numerical Aperture) lens, an incidence angle of light to the substrate becomes shallow so that reflection of the substrate is increased, and thus, an antireflection film having a high antireflection effect is required. Accordingly, a tri-layer process using a silicon-containing intermediate film and a hydrocarbon under layer film which are excellent in the antireflection effect was spread at one time.

However, in the multi-layer film for the tri-layer process in which a hydrocarbon series under layer film and an intermediate film containing silicon oxide have been formed by the spin coating, dry etching resistance for double patterning or digging deep holes or grooves is insufficient. On the other hand, a metal series film formed by sputtering or CVD (Chemical Vapor Deposition) is excellent in dry etching resistance as a hard mask, and in particular, a silicon film or a titanium nitride film has been widely used.

Also, for carrying out a lithography of a fine pattern with a narrow focus margin, it is necessary to make the base material flatten. However, a hard mask formed by sputtering or CVD cannot make unevenness of the base material flatten, so that it is necessary to make the film surface flatten by grinding with CMP (Chemical-Mechanical Polishing). On the other hand, a film formed by spin coating has a merit that the film surface of which can be made flatten by a simple and easy process only by spin coating and baking, by applying a material excellent in embedding characteristics.

Further, when the silicon-containing intermediate film is to be formed by sputtering or CVD, it is necessary to raise the temperature of the substrate to about 400° C. At this time, when a usual hydrocarbon film is applied as an under layer film, it is thermally decomposed so that a hydrocarbon material having high heat resistance at 400° C. is required for the under layer film. Such a material may be mentioned a novolac resin of fluorene bisnaphthol or an aldehyde condensate of carbazole and fluorenone (see Patent Documents 1 and 2).

In addition, in the tri-layer process, it has been proposed to form a negative pattern by developing it with an organic solvent. In this case, a margin for subjecting the silicon-containing intermediate film just below the resist to dry etching processing is insufficient since dry etching resistance of the resist film is markedly lowered due to the influences both of remaining the film in which the cyclic protective group having etching resistance has been deprotected, and decreasing the film thickness due to deprotection of the protective group. Thus, it has been investigated to make the silicon-containing intermediate film thin. At present, a film thickness of the silicon-containing intermediate film has been employed in the range of 30 to 40 nm. This has been determined by the reasons that reflection of the substrate becomes the minimum in this range, and the balance between the etching rate for transferring the pattern of the resist film and the etching rate for transferring the pattern of the silicon-containing intermediate film to the hydrocarbon film at the lower layer. On the other hand, to deal with insufficiency of dry etching resistance of the resist film as mentioned above, it is necessary to set the thickness of the silicon-containing intermediate film to 10 to 20 nm. However, when the silicon-containing intermediate film is made thin, two problems arise. One of which is that reflection of the substrate increases, whereby the margin of the lithography is reduced. Another of which is that sufficient resistance cannot be secured for processing the hydrocarbon film at the lower layer by dry etching using the pattern of the silicon-containing intermediate film as a mask.

PRIOR ART DOCUMENTS

Patent Documents

Patent Document 1: Japanese Patent No. 5336306
Patent Document 2: International Patent Laid-Open Publication No. WO 2010/147155

SUMMARY OF THE INVENTION

The present invention has been accomplished in view of the circumstance, and an object thereof is to provide a process for forming a multi-layer film to be used as a resist under layer film in lithography, which process for forming a multi-layer film can reduce reflectance, and useful for a patterning process with high dimensional accuracy in dry etching.

To solve the problems, the present invention provides a process for forming a multi-layer film comprising the steps of:
(1) forming an under layer film onto a substrate by coating an under layer film material containing a resin represented by the following general formula (1) in which a compound having a bisnaphthol group has been made a novolac resin, and curing the same by heat treatment at a temperature in a range of 300° C. or higher and 700° C. or lower for 10 seconds to 600 seconds,
(2) forming a silicon film onto the under layer film,
(3) forming a hydrocarbon film onto the silicon film by coating a hydrocarbon film material, and
(4) forming a silicon-oxidized film onto the hydrocarbon film by coating a silicon-oxidized film material,

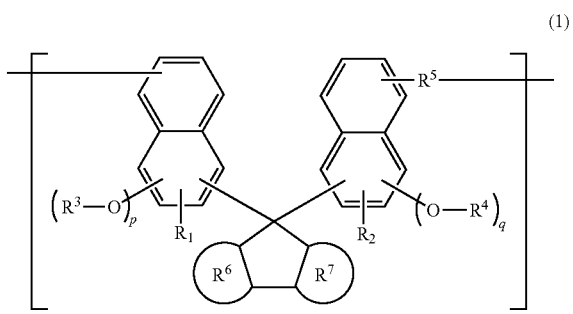

(1)

wherein $R^1$ and $R^2$ each independently represent a hydrogen atom, a linear, branched or cyclic alkyl group having 1 to 10 carbon atoms, an aryl group having 6 to 20 carbon atoms or an alkenyl group having 2 to 20 carbon atoms; $R^3$ and $R^4$ each independently represent a hydrogen atom or a glycidyl group; $R^5$ represents a linear or branched alkylene group having 1 to 10 carbon atoms; $R^6$ and $R^7$ each independently represent a benzene ring or a naphthalene ring, and a hydrogen atom(s) in the benzene ring or the naphthalene ring may be substituted by a hydrocarbon group having 1 to 6 carbon atoms; and "p" and "q" each independently represent 1 or 2.

Such a process for forming a multi-layer film is employed, a multi-layer film which can reduce reflectance, and useful for a patterning process with high dimensional accuracy in dry etching can be formed.

Also, at this time, it is preferred that coating of the materials of the step (1), the step (3), and the step (4) be carried out by the spin coating method.

When the spin coating method is employed, an under layer film, a hydrocarbon film and a silicon-oxidized film each having high flatness at the film surface can be formed by a simple and easy process.

Further, at this time, it is preferred that the step (2) be carried out by a sputtering method or a vapor phase epitaxial growth method.

When the sputtering method or the vapor phase epitaxial growth method is employed, a silicon film excellent in dry etching resistance can be formed easily.

Also, at this time, it is preferred that the under layer film having a film thickness of 30 to 20,000 nm be formed in the step (1), the silicon film having a film thickness of 3 to 100 nm be formed in the step (2), the hydrocarbon film having a film thickness of 5 to 100 nm be formed in the step (3), and the silicon-oxidized film having a film thickness of 10 to 20 nm be formed in the step (4).

By making each layer such a film thickness, reflectance can be further reduced, and dimensional accuracy of dry etching can be further heightened.

Also, the present invention provides a patterning process which comprises the steps of:
(A) forming a photoresist film on a multi-layer film which has been formed on a substrate by the above-mentioned process for forming a multi-layer film,
(B) forming a photoresist pattern by subjecting to exposure and development to the photoresist film,
(C) transferring the pattern to the silicon-oxidized film by subjecting to dry etching using the photoresist pattern as a mask,
(D) transferring the pattern to the hydrocarbon film by subjecting to dry etching using the silicon-oxidized film to which the pattern has been transferred as a mask,
(E) transferring the pattern to the silicon film by subjecting to dry etching using the hydrocarbon film to which the pattern has been transferred as a mask, and
(F) transferring the pattern to the under layer film by subjecting to dry etching using the silicon film to which the pattern has been transferred as a mask.

Such a patterning process is employed, it becomes a patterning process in which reflectance can be reduced, and dimensional accuracy of dry etching is high.

At this time, it is preferred that the dry etching of the step (F) be carried out by using one or more etching gases selected from an oxygen gas, a hydrogen gas, an ammonia gas, a carbon dioxide gas, a carbon monoxide gas and a sulfur dioxide gas.

By using such an etching gas, pattern transfer to the under layer film by dry etching can be efficiently carried out.

As mentioned above, when the process for forming a multi-layer film of the present invention is employed, a multi-layer film which can be suitably used as a resist under layer film in the lithography and having optimum n value and k value, and embedding characteristics as an antireflection film, and having excellent etching resistance can be formed. In addition, when the patterning process of the present invention using such a multi-layer film is employed, a pattern is formed, for example, by a 5-layers (penta-layer) process with the multi-layer film having the above-mentioned characteristics and a photoresist film, and in particular, even when a negative tone resist pattern developed by an organic solvent which is thin and vulnerable in dry etching resistance is used, the pattern can be transferred with high accuracy.

Further, by using a material having high heat resistance to form the under layer film by the spin coating method, the under layer film can be made a film which can endure a high temperature treatment by sputtering or CVD when a silicon film is to be formed thereon. Thus, a patterning process combining an under layer film obtained by the spin coating method and a silicon film obtained by the sputtering or CVD can be provided.

BRIEF DESCRIPTION OF THE DRAWINGS

FIG. 1 is a flow chart showing one example of the process for forming a multi-layer film of the present invention;

FIG. 2 is a flow chart showing one example of the patterning process of the present invention;

Figure 3A:
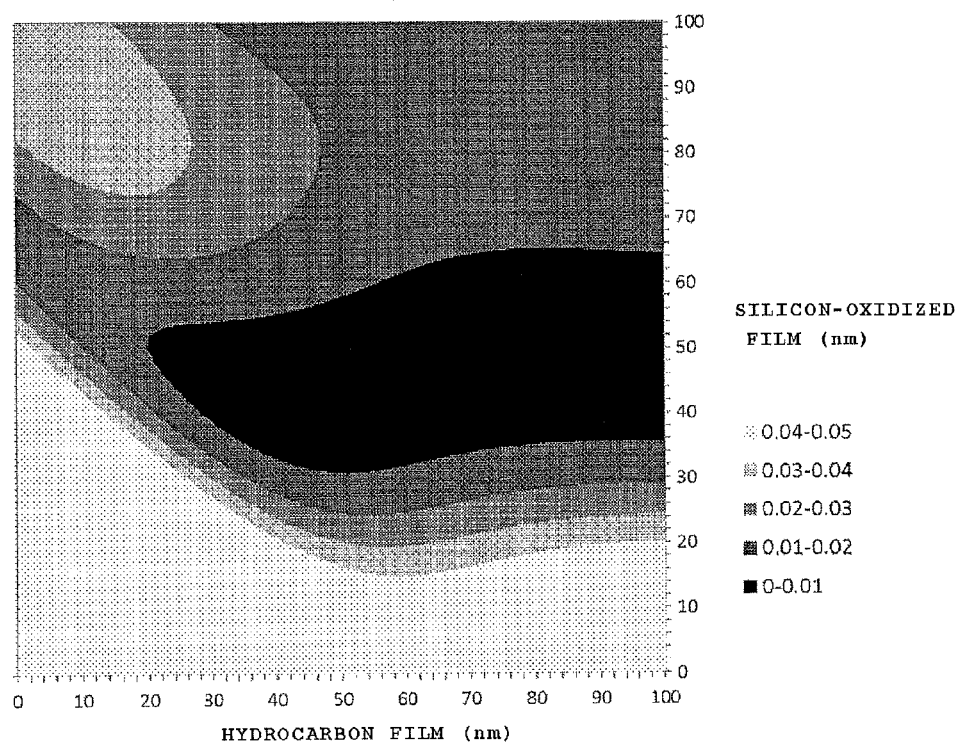
FIG. 3A is a graph showing the reflectance of the substrate when the respective film thicknesses of a silicon-oxidized film (n value=1.6 and k value=0.2) and a hydrocarbon film (n value=1.4 and k value=0.4) are changed in the range of 0 to 100 nm at a wavelength of 193 nm, NA=1.35 and using dipole illumination in the S-layers process.
Figure 3B:
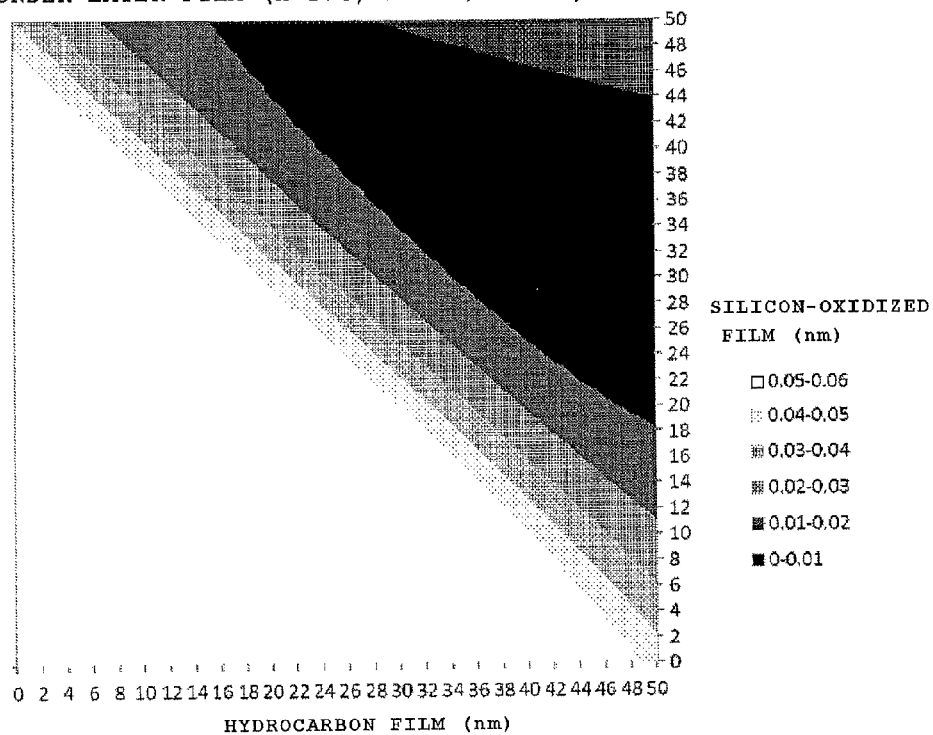
Figure 3C:
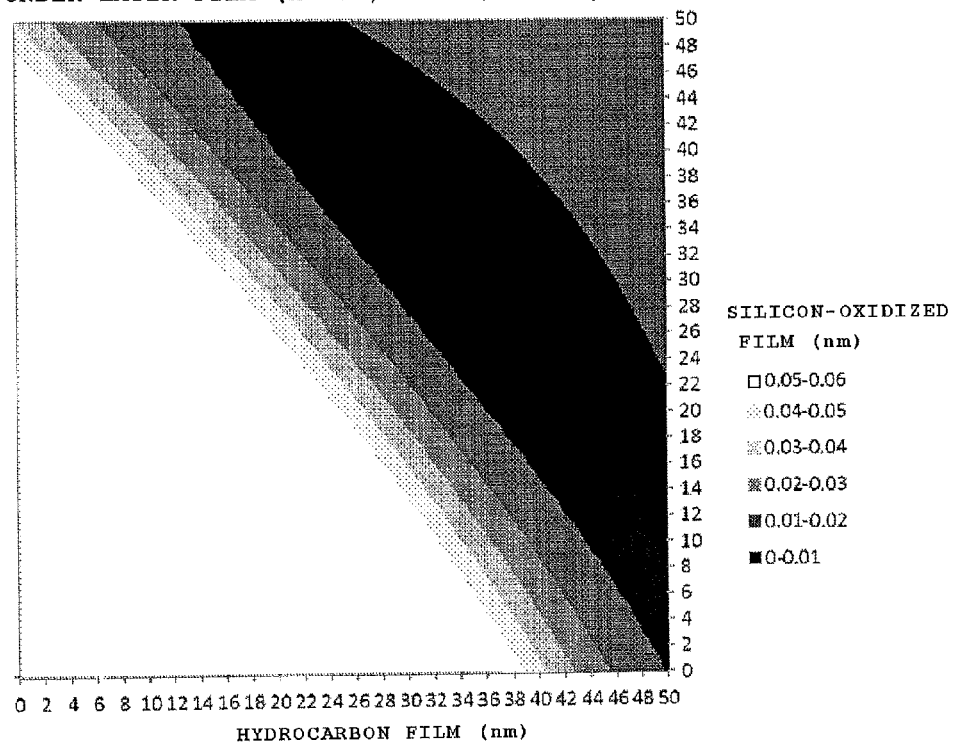
Figure 3D:
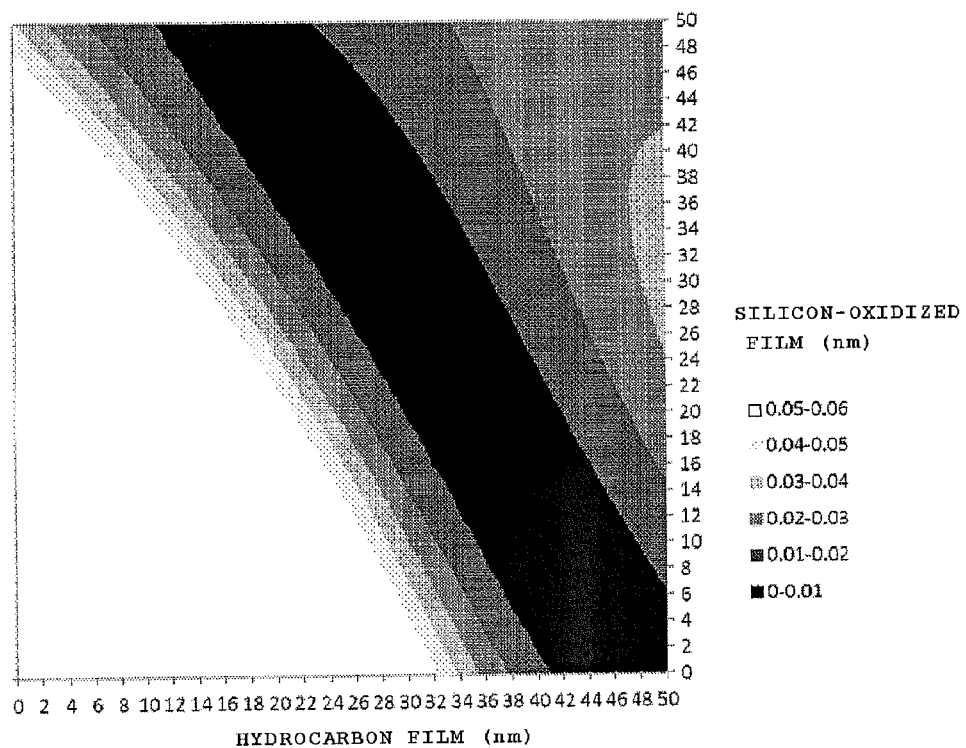

FIG. 3B is a graph showing the reflectance of the substrate when an under layer film (n value=1.4 and k value=0.4; film thickness 100 nm) and a silicon film (film thickness 10 nm) are used, and the respective film thicknesses of a silicon-oxidized film (n value=1.6 and k value=0.2) and a hydrocarbon film (n value=1.5 and k value=0.3) are changed in the range of 0 to 50 nm at a wavelength of 193 nm, NA=1.35 and using dipole illumination in the 5-layers process;

FIG. 3C is a graph showing the reflectance of the substrate when an under layer film (n value=1.4 and k value=0.4; film thickness 100 nm) and a silicon film (film thickness 10 nm) are used, and the respective film thicknesses of a silicon-oxidized film (n value=1.6 and k value=0.2) and a hydrocarbon film (n value=1.6 and k value=0.3) are changed in the range of 0 to 50 nm at a wavelength of 193 nm, NA=1.35 and using dipole illumination in the 5-layers process; and FIG. 3D is a graph showing the reflectance of the substrate when an under layer film (n value=1.4 and k value=0.4; film thickness 100 nm) and a silicon film (film thickness 10 nm) are used, and the respective film thicknesses of a silicon-oxidized film (n value=1.6 and k value=0.2) and a hydrocarbon film (n value=1.7 and k value=0.3) are changed in the range of 0 to 50 nm at a wavelength of 193 nm, NA=1.35 and using dipole illumination in the 5-layers process.

DETAILED DESCRIPTION OF THE PREFERRED EMBODIMENTS

As mentioned above, the patterning process by a multi-layer resist film having tri-layer structure has more excellent pattern transfer precision than a single layer resist film or the method in which of using an organic antireflection film is laid under the resist film, but due to thinning of the resist film accompanied by the progress of miniaturization and lowering in dry etching resistance of the resist film, a problem of lowering in transfer precision of the pattern is generated even when the tri-layer process is employed. Thus, it has been desired to construct a process for forming a multi-layer film which can heighten pattern transfer precision, and a patterning process using the same.

Here, in FIG. 3A, in a substrate for a tri-layer process in which just below the resist film is a silicon-oxidized film (n value=1.6 and k value=0.2), under the silicon-oxidized film is a hydrocarbon film (n value=1.4 and k value=0.4), and the substrate is Si, reflectance of the substrate when film thicknesses of the hydrocarbon film and the silicon-oxidized film are changed is shown. Incidentally, at this time, liquid immersion lithography with a wavelength of 193 nm and dipole illumination of NA=1.35 as an optical illumination is employed. Also, gradations in the graph show that denser the color is, the lower the reflectance of the substrate is. From FIG. 3A, in the case of the tri-layer process, it can be understood that in the region of the film thickness of the silicon-oxidized film of 35 to 60 nm, there exist a black region where the reflectance is 1% or less even when the film thickness of the hydrocarbon film is changed, but when the silicon-oxidized film is set to 35 nm or less, reflection of the substrate increases. From these results, it can be understood that reduction of the reflectance and film-thinning of the silicon-oxidized film cannot be achieved simultaneously in the tri-layer process.

In the case of a tri-layer comprising a resist film, a silicon-oxidized film and a hydrocarbon film, it is necessary to make reflection of the substrate constant by filling unevenness of the substrate even when the film thickness of the hydrocarbon film is changed. Therefore, a thick layer region at which reflection of the substrate becomes constant even when the film thickness of the hydrocarbon film is changed is used, and further, a material having high absorption, i.e., having a large k value is selected so that reflection of the substrate becomes constant. From the viewpoint of suppressing reflection alone, the optimum k value of the hydrocarbon film is 0.2 to 0.3, but according to this value, absorption is not sufficient, and reflection of the substrate increases or decreases depending on the effect of fluctuation of the film thickness of the hydrocarbon film. Therefore, a material having the k value of 0.4 or more is used for the tri-layer process by the reason as mentioned above. However, in this case, if the film thickness of the silicon-oxidized film is made thin as 20 nm or less, the problem occurs that reflection increases.

Also, in a resist pattern by negative development, etching resistance is extremely low by the influences of thinning the resist film thickness accompanied by the progress of miniaturization, and shrink of the film thickness due to deprotection of a cyclic protective group which improves etching resistance. It has been investigated to make the silicon-oxidized film just below the resist film thin to transfer the resist pattern having extremely low etching resistance, but in the case of the tri-layer process, if the silicon-oxidized film is made thin, reflection of the substrate increases as mentioned above, so that there is a problem that a margin of lithography is lowered.

The present inventors have focused an attention on pattern formation by a penta-layer process as a solving means of such a problem.

Here, in FIG. 3B, in a substrate for a penta-layer process in which just below the resist film is a silicon-oxidized film (n value=1.6 and k value=0.2), under the silicon-oxidized film is a hydrocarbon film (n value=1.5 and k value=0.3), under the hydrocarbon film is a polysilicon film (film thickness: 10 nm), under the polysilicon film is an under layer film (n value=1.4 and k value=0.4; film thickness: 100 nm) and the substrate is Si, reflectance of the substrate when film thicknesses of the hydrocarbon film and the silicon-oxidized film are changed is shown. From FIG. 3B, in the case of the penta-layer process, it can be understood that there exist a region which gives reflection of the substrate of 1% or less even when the film thickness of the silicon-oxidized film is made thin as about 20 nm. From this results, it can be understood that both of reduction of the reflectance and film-thinning of the silicon-oxidized film can be achieved simultaneously in the penta-layer process.

Further, in FIG. 3C, in the above-mentioned substrate for penta-layer process, reflectance of the substrate where the n value of the hydrocarbon film is heightened (n value=1.6 and k value=0.3) is shown, and in FIG. 3D, in the above-mentioned substrate for the penta-layer process, reflectance of the substrate where the n value of the hydrocarbon film is further heightened (n value=1.7 and k value=0.3) is shown. From FIG. 3C and FIG. 3D, it can be understood that if the n value of the hydrocarbon film is heightened in the penta-layer process, a region which can suppress reflection of the substrate even when the silicon-oxidized film is made thin as 20 nm or less is broadened to the thin layer side of the hydrocarbon film.

From the above facts, the present inventors have found out that, when embedding and flattening of a substrate is carried out by an under layer film and a silicon film such as a polysilicon film is formed thereon, light is totally reflected on the polysilicon film, but an antireflection film (a hydrocarbon film and a silicon-oxidized film) coated thereon does not change the reflectance even when the film thickness is fluctuated since the base material has already been flat, so that a film thickness with the exactly minimum reflection can be selected. Also, they have found that a film thickness of the silicon-oxidized film can be made thin by selecting particularly a material having a high n value as a hydrocarbon film.

Further, in the conventional patterning process by the tri-layer process, when an amorphous carbon film is formed at lower layer, and a hard mask which has also a function as an antireflection film such as SiON, etc., is formed thereon, the SiON hard mask shows excellent etching resistance to the amorphous carbon film which is formed at lower layer, and the amorphous carbon film also shows excellent dry etching resistance to the substrate to be processed which is positioned thereunder. This is a firm combination in the viewpoint of dry etching resistance. The CVD method is employed for film formation of the amorphous carbon film, however, unevenness of the substrate which becomes a substrate to be processed cannot be made flat by the CVD method, so that it is necessary to plane the surface of the amorphous carbon film by the CMP method to make the substrate surface flat. That is, there arises the problem that the processing cost is increased by being applied the CMP process thereto.

On the other hand, for forming a flat carbon film surface, coating by the spin coating is effective. In this case, a flat carbon film on the film surface can be formed by the simple and easy process of coating and baking, so that throughput thereof is rapid and the cost is low. That is, in the present invention, for embedding and flattening of the substrate by the under layer film, formation of the under layer film by the spin coating is effective.

Further, as mentioned above, it is general to form a silicon film on the under layer film by the CVD method or the sputtering method, and both of the CVD method and the sputtering method are carried out by raising the temperature of the substrate at 400° C. or higher in vacuum to form the silicon film. Accordingly, as the coating type under layer film which becomes a base material of the silicon film in the present invention, it is required to have high heat resistance of 400° C. or higher. The present inventors have conceived to use a novolac resin of a specific bisnaphthol compound as an under layer film material having such a high heat resistance, whereby they have accomplished the present invention.

That is, the present invention is a process for forming a multi-layer film, comprising the steps of:

(1) forming an under layer film onto a substrate by coating an under layer film material containing a resin represented by the following general formula (1) in which a compound having a bisnaphthol group has been made a novolac resin, and curing the same by heat treatment at a temperature in a range of 300° C. or higher and 700° C. or lower for 10 seconds to 600 seconds, (2) forming a silicon film onto the under layer film, (3) forming a hydrocarbon film onto the silicon film by coating a hydrocarbon film material, and (4) forming a silicon-oxidized film onto the hydrocarbon film by coating a silicon-oxidized film material,

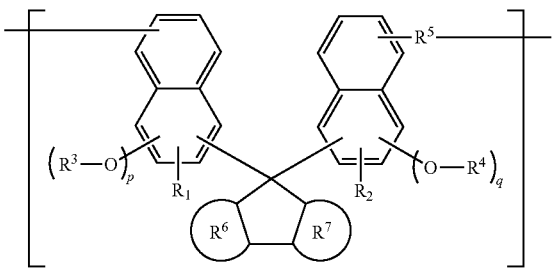

(1)

wherein $R^1$ and $R^2$ each independently represent a hydrogen atom, a linear, branched or cyclic alkyl group having 1 to 10 carbon atoms, an aryl group having 6 to 20 carbon atoms or an alkenyl group having 2 to 20 carbon atoms; $R^3$ and $R^4$ each independently represent a hydrogen atom or a glycidyl group; $R^5$ represents a linear or branched alkylene group having 1 to 10 carbon atoms; $R^6$ and $R^7$ each independently represent a benzene ring or a naphthalene ring, and a hydrogen atom(s) in the benzene ring or the naphthalene ring may be substituted by a hydrocarbon group having 1 to 6 carbon atoms; and "p" and "q" each independently represent 1 or 2.

In the following, the process for forming a multi-layer film of the present invention is explained in detail, but the present invention is not limited by these.

<Process for Forming Multi-Layer Film>

FIG. 1 is a flow chart showing one example of the process for forming a multi-layer film of the present invention. In the process for forming a multi-layer film of FIG. 1, (1) an under layer film material is coated onto a layer to be processed 2 which has been formed on a substrate 1, and cured by the heat treatment at a temperature in the range of 300° C. or higher and 700° C. or lower for 10 seconds to 600 seconds to form an under layer film 3, (2) a silicon film 4 is formed onto the under layer film 3 by sputtering or CVD, (3) a hydrocarbon film material is coated onto the silicon film 4 to form a hydrocarbon film 5, and (4) a silicon-oxidized film material is coated onto a hydrocarbon film 5 to form a silicon-oxidized film 6, whereby a multi-layer film is formed onto the substrate 1 (the layer to be processed 2).

In the following, each step for forming a multi-layer film of the present invention is explained in more detail.

[Step (1)]

In the step (1) of the process for forming a multi-layer film of the present invention, an under layer film material containing a resin represented by the general formula (1) in which a compound having a bisnaphthol group has been made a novolac resin is coated onto a substrate, and cured by a heat treatment at a temperature in the range of 300° C. or higher and 700° C. or lower for 10 seconds to 600 seconds to form an under layer film.

(Substrate (Substrate to be Processed))

As the substrate (the substrate to be processed) to be used in the process for forming a multi-layer film of the present invention, a substrate on which a layer to be processed is formed is preferably used. The substrate is not particularly limited, and a material comprising Si, α-Si, p-Si, $SiO_2$, SiN, SiON, W, TiN, Al, etc., and a material different from that of the layer to be processed is suitably used. As the layer to be processed, various kinds of low-k films such as Si, $SiO_2$, SiON, SiN, p-Si, α-Si, W, W—Si, Al, Cu, Al—Si, etc., and its stopper film are suitably used, and it can be generally formed with a thickness of 50 to 10,000 nm, in particular, 100 to 5,000 nm.

(Under Layer Film)

The under layer film material to be used in the process for forming a multi-layer film of the present invention contains a resin represented by the following general formula (1) in which a compound having a bisnaphthol group (hereinafter also referred to as a bisnaphthol compound) has been made a novolac resin, and by containing such a novolac resin in which the bisnaphthol compound containing a fluorene or a benzofluorene has been condensed, an under layer film excellent in etching resistance and having high transparency can be formed,

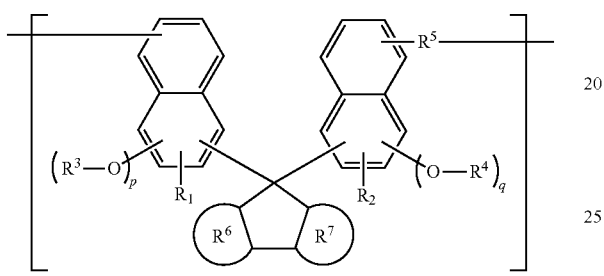

(1)

wherein $R^1$ and $R^2$ each independently represent a hydrogen atom, a linear, branched or cyclic alkyl group having 1 to 10 carbon atoms, an aryl group having 6 to 20 carbon atoms or an alkenyl group having 2 to 20 carbon atoms; $R^3$ and $R^4$ each independently represent a hydrogen atom or a glycidyl group; $R^5$ represents a linear or branched alkylene group having 1 to 10 carbon atoms; $R^6$ and $R^7$ each independently represent a benzene ring or a naphthalene ring, and a hydrogen atom(s) in the benzene ring or the naphthalene ring may be substituted by a hydrocarbon group having 1 to 6 carbon atoms; and "p" and "q" each independently represent 1 or 2.

Incidentally, the under layer film material comprises
(i) the novolac resin represented by the general formula (1) as an essential component, and generally contains
(ii) an organic solvent, and may further contain
(iii) a polymer other than the resin of the (i),
(iv) a crosslinking agent,
(v) an acid generator, etc., if necessary, for improving spin coating characteristics, embedding characteristics of the stepped substrate, and rigidity or solvent resistance of the film.

Illustrative examples of the bisnaphthol compound for obtaining the novolac resin represented by the general formula (1) include the followings,

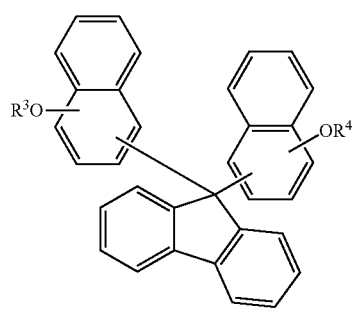

-continued

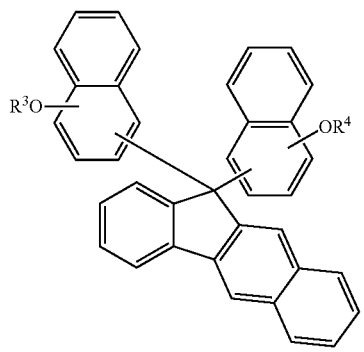

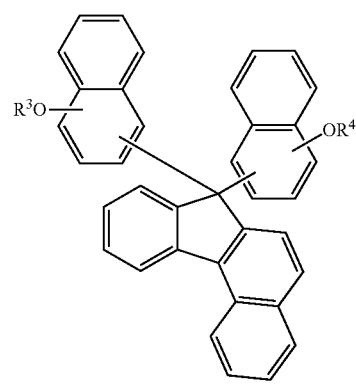

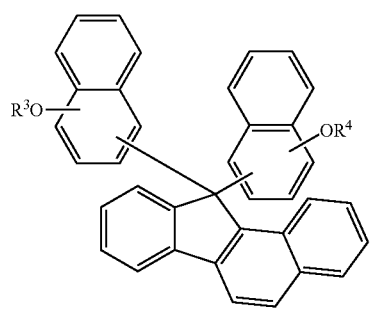

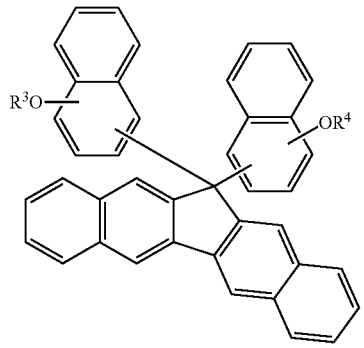

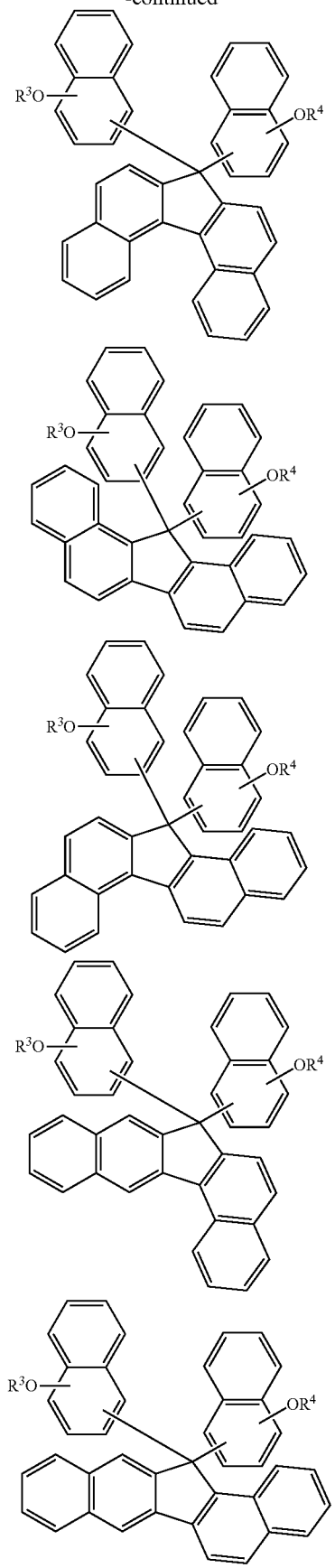

-continued

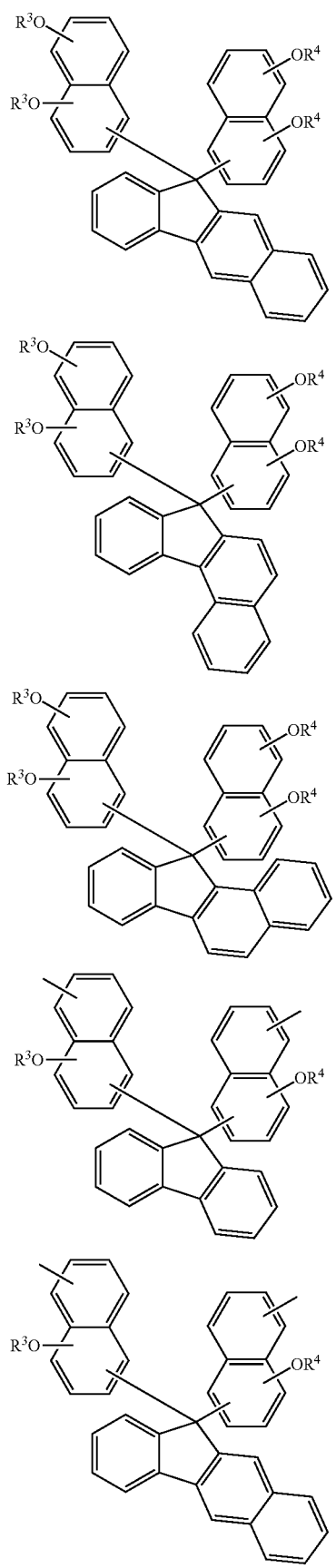

-continued

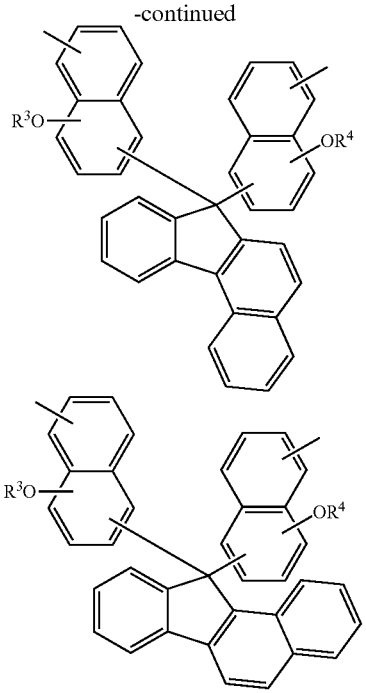

wherein $R^3$ and $R^4$ have the same meanings as defined above.

The fluorene bisnaphthol has a cardo structure of a quaternary carbon, whereby it has extremely high heat resistance. When an inorganic hard mask intermediate film (silicon film) is to be formed on the under layer film by CVD, etc., a high temperature exceeding 400° C. is necessary so that the under layer film is also required to have high heat resistance. Also, the fluorene bisnaphthol has a relatively small absorption at a wavelength of 193 nm due to absorption shift to a longer wavelength side by the naphthalene, so that it can be expected to have good antireflection effect when it is used in the multi-layer process. Further, as compared to the fluorene bisphenol, the fluorene bisnaphthol has high etching resistance since a number of the hydrogen atoms is reduced as a number of the aromatics increases, and further, by baking it at a temperature exceeding 400° C., it has further high etching resistance and solvent resistance, and occurrence of wiggling of the pattern during etching of the substrate can be suppressed.

Among the compounds, a fluorene bisnaphthol in which $R^3$ and $R^4$ are H (hydrogen atoms) can be obtained by reacting a naphthol and a corresponding fluorenone according to the usual manner, and a compound in which $R^3$ and $R^4$ are glycidyl groups can be obtained by glycidylating the hydroxyl group of the naphthol compound obtained by the method according to the usual manner.

In the under layer film material to be used in the process for forming a multi-layer film of the present invention, a resin in which the bisnaphthol compound as mentioned above has been made a novolac resin by the condensation reaction with the aldehydes is used. The aldehydes herein used may be mentioned, for example, formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthaldehyde, 2-naphthaldehyde, furfural, etc.

Among these, formaldehyde can be particularly suitably used. In addition, these aldehydes may be used alone or in combination of two or more kinds. An amount of the aldehydes to be used is preferably 0.2 to 5 mol, more preferably 0.5 to 2 mol, based on 1 mol of the bisnaphthol compound.

A catalyst may be used in the condensation reaction of the bisnaphthol compound and the aldehydes. The catalyst may be specifically mentioned an acidic catalyst such as hydrochloric acid, nitric acid, sulfuric acid, formic acid, oxalic acid, acetic acid, methanesulfonic acid, camphor sulfonic acid, tosic acid, trifluoromethanesulfonic acid, etc.

An amount of these acidic catalysts to be used is $1\times10^{-5}$ to $5\times10^{-1}$ mol based on 1 mol of the bisnaphthol compound. In the case of the copolymerization reaction with the compound having a non-conjugated double bond(s) such as styrene, hydroxystyrene, vinylnaphthalene, hydroxyvinylnaphthalene, carbazole, vinylcarbazole, vinylanthrathene, indene, hydroxyindene, benzofuran, hydroxyanthrathene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, etc., the aldehydes are not necessarily required.

Preferable examples of a reaction solvent used in the polycondensation include water, methanol, ethanol, propanol, butanol, tetrahydrofuran, dioxane, or a mixed solvent thereof. These solvents are preferably used in the range of 0 to 2,000 parts by mass based on 100 parts by mass of the reaction starting materials.

A reaction temperature may be optionally selected depending on the reactivities of the reaction starting materials, and generally in the range of 10 to 200° C.

As a method of the polycondensation, there are methods in which the bisnaphthol compound, the aldehydes and the catalyst are charged at once and a method in which the bisnaphthol compound and the aldehydes are added by dropwise in the presence of the catalyst. After completion of the polycondensation reaction, the volatile component(s) can be removed by raising the temperature in the reaction vessel to 130 to 230° C. and reducing the pressure to about 1 to 50 mmHg for the purpose of removing the unreacted starting materials and the catalyst, etc., existing in the reaction system.

The bisnaphthol compound for obtaining the novolac resin represented by the general formula (1) may be polymerized alone, and other phenols may be copolymerized. Illustrative examples of the copolymerizable phenols include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, etc.

Illustrative examples of the other copolymerizable monomer(s) include 1-naphthol, 2-naphthol, 2-methyl-1-naphthol, 4-methoxy-1-naphthol, 7-methoxy-2-naphthol and a dihydroxynaphthalene such as 1,5-dihydroxynaphthalene, 1,7-dihydroxynaphthalene, 2,6-dihydroxynaphthalene, etc., methyl 3-hydroxy-naphthalene-2-carboxylate, 4-tritylphenol, indene, hydroxyindene, benzofuran, hydroxyanthrathene, dihydroxyanthrathene, trihydroxyanthrathene, hydroxypyrene, acenaphthylene, biphenyl, bisphenol, trisphenol, xylene, dicyclopentadiene, tetrahydroindene, 4-vinylcyclohexene, norbornadiene, 5-vinylnorborna-2-ene, α-pinene, β-pinene, limonene, etc., and the resin may be a copolymer of ternary or more adding these components.

It is also possible to co-condense with aromatic compounds substituted by a hydroxymethyl group, an alkoxymethyl group, a halomethyl group, etc. by reacting the aromatic compounds and aldehydes. Illustrative examples of the aromatic compounds substituted by an alcohol such as a hydroxymethyl group include benzenedimethanol, benzenetrimethanol, toluenedimethanol, ethylbenzenedimethanol, propylbenzenedimethanol, butylbenzenedimethanol, cyclohexylbenzenedimethanol, xylenedimethanol, mesitylenedimethanol, naphthalenedimethanol, naphthalenetrimethanol, methylnaphthalenedimethanol, ethylnaphthalenedimethanol, propylnaphthalenedimethanol, butylnaphthalenedimethanol, dimethylnaphthalenedimethanol, anthracenedimethanol, phenanthrenedimethanol, pyrenedimethanol, pentacenedimethanol, fluorenedimethanol, biphenyldimethanol, bisnaphthalenedimethanol, fluoranthenedimethanol, indenedimethanol, acenaphthylenedimethanol, acephenanthrylenedimethanol and aceanthrylenedimethanol. The aromatic compounds substituted by an alkoxymethyl group are compounds in which the hydroxymethyl group of the above-mentioned compounds is substituted by an alkoxymethyl group, the aromatic compounds substituted by a halomethyl group are compounds in which the hydroxymethyl group of the above-mentioned compounds is substituted by a halomethyl group. In this case, the aldehyde is not necessarily required at the time of co-condensation reaction.

A molecular weight of the novolac resin represented by the general formula (1) in terms of the polystyrene preferably used is a weight average molecular weight (Mw) of 1,000 to 30,000, particularly preferably 2,000 to 20,000. Those having a molecular weight distribution in the range of 1.2 to 7 are preferably used, and those in which a monomer component, an oligomer component, or a low molecular weight component having a molecular weight (Mw) of 1,000 or less has cut to narrow the molecular weight distribution are preferred since crosslinking efficiency becomes high, and a volatile component(s) during baking is suppressed whereby contamination in the vicinity of the baking cup can be prevented.

The novolac resin represented by the general formula (1) may be blended with the other polymer(s). The polymer for blend is suitably a polymer having a function of improving film-forming property in the spin coating or embedding characteristics of the stepped substrate by mixing with the novolac resin represented by the general formula (1). More specifically, a polymer which can lower a softening point such as polyethylene glycol, polypropyrene glycol, polyacrylate, polymethacrylate, polyacetal, polyvinyl ether, etc., is suitable.

In addition, a material having high carbon density and having high etching resistance may be blended. Such a material may be mentioned the same materials as exemplified by the hydrocarbon film material later.

A formulation amount of the polymer for blend may be preferably 0 to 1,000 parts by mass, more preferably 0 to 500 parts by mass based on 100 parts by mass of the novolac resin represented by the general formula (1).

Also, to the under layer film material to be used in the process for forming a multi-layer film of the present invention, a monomer component to be used for condensation of the novolac resin represented by the general formula (1) may be added. Addition of the monomer component has a merit of improving embedding characteristics without changing an optical constant. An amount thereof to be added is preferably 0 to 1,000 parts by mass, more preferably 0 to 500 parts by mass based on 100 parts by mass of the novolac resin, and the amount to be added can be optionally adjusted while observing the embedding characteristics. If the amount of the monomer component to be added is too much, it becomes an outgas during baking to generate particles, so that a baking furnace is contaminated in some cases. Thus, when the monomer component is to be added, it is preferred to keep the amount to be added minimum which can ensure the embedding characteristics.

As the performances that has heretofore been required for the resist under layer film having an antireflection film function, there may be mentioned that there is no intermixing with the resist intermediate layer film containing silicon and the resist upper layer film formed on the resist under layer film, and there is no diffusion of the low molecule component to the resist upper layer film and the resist intermediate layer film (Proc. SPIE Vol. 2195, pp. 225-229 (1994)). To prevent these problems, there has generally been employed a method that the material is thermally crosslinked by baking after spin coating of the antireflection film.

Therefore, in the present invention, when a crosslinking agent is added as a component of the material for forming a multi-layer film (an under layer film material, a silicon-oxidized film material mentioned later, a hydrocarbon film material mentioned later, etc.), a crosslinkable substituent may be introduced into the polymer in the material. Even when the crosslinking agent is not added, the above-mentioned fluorene bisnaphthol novolac resin to be used in the under layer film material can be crosslinked by heating exceeding at 300° C. according the reaction mechanism mentioned later.

(Additive)

A crosslinking agent may be added to the material for forming a multi-layer film to be used in the process for forming a multi-layer film of the present invention. The crosslinking agent may be specifically mentioned the materials described at the paragraphs (0055) to (0060) of Japanese Patent Laid-Open Publication No. 2007-199653.

Also, to the material for forming a multi-layer film to be used in the process for forming a multi-layer film of the present invention, an acid generator for further promoting the crosslinking reaction by heat can be added. As the acid generator, there is a material which generates an acid by heat decomposition or a material which generates an acid by photoirradiation, and either of which may be added. The acid generator may be specifically mentioned the materials disclosed at the paragraphs (0061) to (0085) of Japanese Patent Laid-Open Publication No. 2007-199653.

Further, to the material for forming a multi-layer film to be used in the process for forming a multi-layer film of the present invention, a basic compound for improving preservation stability can be added. The basic compound acts as a role of a quencher to an acid for preventing from promoting the crosslinking reaction by the acid which has been generated from the acid generator with a minor amount. Such a basic compound may be specifically mentioned the materials disclosed at the paragraphs (0086) to (0090) of Japanese Patent Laid-Open Publication No. 2007-199653.

Moreover, to the material for forming a multi-layer film to be used in the process for forming a multi-layer film of the present invention, it is preferred to add a solvent such as an organic solvent and water, etc. As the organic solvent which can be used, it is not particularly limited so long as it can dissolve the polymer, the acid generator, the crosslinking agent, and other additives, etc., to be used in the material. There may be specifically mentioned the solvents disclosed at the paragraphs (0091) to (0092) of Japanese Patent Laid-Open Publication No. 2007-199653.

Furthermore, to the material for forming a multi-layer film to be used in the process for forming a multi-layer film of the present invention, a surfactant may be added for improving coatability at the spin coating. The surfactant may be specifically mentioned the materials disclosed at the paragraphs (0165) to (0166) of Japanese Patent Laid-Open Publication No. 2008-111103.

The under layer film material to be used in the process for forming a multi-layer film of the present invention is coated onto the substrate to be processed by the spin coating method, etc., similarly to that of a photoresist film material mentioned later. By using the spin coating method, etc., good embedding characteristics can be obtained.

Further, after spin coating, baking is carried out to evaporate the solvent whereby preventing from mixing with the silicon film formed at the upper layer, and to promote the crosslinking reaction. Baking is carried out at a temperature in the range of 300° C. or higher and 700° C. or lower, preferably at 350° C. or higher and 600° C. or lower, more preferably at 400° C. or higher and 600° C. or lower, further preferably at 500° C. or higher and 600° C. or lower for 10 to 600 seconds, preferably for 10 to 300 seconds. Since the temperature at the time of forming the silicon film onto the under layer film is in the range of 400 to 600° C., it is necessary to previously bake the under layer film at the temperature for preventing from generating an outgas from the under layer film at the time of forming the silicon film. Moreover, by subjecting ultrahigh temperature baking to the under layer film, etching resistance thereof can be heightened when the substrate to be processed thereunder is to be subjected to dry etching.

The novolac resin generates phenoxy radicals by heating and methylene groups of the novolac bonds are activated to crosslink the methylene groups to each other. Since this reaction is a radical reaction, no releasing molecule generates so that no film shrinkage by crosslinking occurs if a material having high heat resistance is used. If an oxygen exists during baking, crosslinking due to oxidative coupling also proceeds. For promoting crosslinking by oxidative coupling, baking in the atmosphere is carried out.

Baking may be carried out on a hot plate, and may be carried out in a furnace. When the furnace is used, a large amount of wafers can be treated at once so that high throughput can be obtained.

Baking may be carried out in the atmosphere, or may be carried out in an inert gas such as nitrogen, helium, argon gas, etc., and a shrinkage amount of the film becomes less when baking is carried out in the inert gas. In addition, when baking is carried out in the inert gas, oxidation can be prevented so that it can prevent from increasing in absorption or lowering etching resistance. Baking in the inert gas is preferably carried out at baking after crosslinking. Also, for preventing from oxidation, an oxygen concentration is preferably controlled, and the oxygen concentration in the inert gas is preferably 1,000 ppm or less, more preferably 100 ppm or less.

It may be also carried out baking for crosslinking after coating the under layer film material, and thereafter, baking (high temperature baking) before formation of the silicon film. When the oxidative coupling reaction is used as the crosslinking reaction, it is preferred to carry out baking for crosslinking in the atmosphere firstly after coating, and then, high temperature baking in the inert gas.

Also, up to now, a fluorocarbon series gas has been used in dry etching of the substrate to be processed, a phenomenon that a line of the under layer film bends after dry etching occurs in some cases. This bending of the line is considered to be caused by the reason that the under layer film is fluorinated during dry etching whereby the volume thereof is increased. To the contrary, when an under layer film which had been subjected to high temperature baking as in the present invention is used, it becomes a dense and rigid under layer film, so that there is a merit that bending of the line of the under layer film after dry etching difficultly occurs.

Incidentally, a thickness of the under layer film is optionally selected, and it is preferred to set 30 to 20,000 nm, more preferably 50 to 15,000 nm, further preferably 80 to 10,000 nm.

[Step (2)]

In the step (2) of the process for forming a multi-layer film of the present invention, a silicon film is formed on the under layer film formed as mentioned above.

(Silicon Film)

Formation of the silicon film is preferably carried out by a sputtering method or a vapor phase epitaxial growth method such as a CVD method, etc. A film thickness of the silicon film is preferably made 3 to 100 nm, more preferably 5 to 50 nm. Since the silicon film is an extremely excellent hard mask, it may be a thin film.

Also, as the silicon film, a polysilicon film is preferred, and it may be a film comprising an alloy with tungsten, titanium and/or tantalum.

Onto the silicon film, a hydrocarbon film for usual tri-layer process is formed (Step (3)), a silicon-oxidized film is formed thereon (Step (4)), and a photoresist film is further formed thereon (Step (A) of a patterning process mentioned later). Exposure light is reflected on the silicon film, and does not reach to the under layer film under the same. Reflection can be suppressed by controlling a phase and an absorption of the two layers of the hydrocarbon film and the silicon-oxidized film on the silicon film as antireflection films. If then value of the refractive index of the hydrocarbon film is a value close to the n value of the photoresist film, reflection of the substrate can be made 1% or less even when the film thickness of the silicon-oxidized film is made 20 nm or less. As described above, it is one of the objects of the present invention to accomplish both of reducing reflectance of the substrate and making the silicon-oxidized film thin, and accordingly, it is important to select a material having a high n value for the hydrocarbon film under the silicon-oxidized film to make the silicon-oxidized film just below the photoresist film a thin film having a film thickness of 20 nm or less.

[Step (3)]

In the step (3) of the process for forming a multi-layer film of the present invention, a hydrocarbon film material is coated onto the silicon film formed as mentioned above to form a hydrocarbon film.

(Hydrocarbon Film)

As the hydrocarbon film material to be used in the process for forming a multi-layer film of the present invention, a material having high carbon density and high etching resistance is selected. Illustrative examples of such a material include a novolac resin prepared by phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol and dihydroxynaphthalene such as 1,5-dihydroxynaphthalene, 1,7-dihydroxynaphthalene, 2,6-dihydroxynaphthalene, etc., methyl 3-hydroxy-naphthalene-2-carboxylate, indene, hydroxyindene, benzofuran, hydroxyanthrathene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, etc., polyhydroxystyrene, polystyrene, polyvinylnaphthalene, polyvinylanthrathene, polyvinylcarbazole, polyindene, polyacenaphthylene, polynorbornene, polycyclodecene, polytetracyclododecene, polynortricyclene, poly(meth)acrylate and a copolymer thereof, etc.

In addition, it may be blended by a resin compound including a nortricyclene copolymer disclosed in Japanese Patent Laid-Open Publication No. 2004-205658, a hydrogenated naphthol novolac resin disclosed in Japanese Patent Laid-Open Publication No. 2004-205676, a naphthol dicyclopentadiene copolymer disclosed in Japanese Patent Laid-Open Publication No. 2004-205685, a phenol dicyclopentadiene copolymer disclosed in Japanese Patent Laid-Open Publication No. 2004-354554 and No. 2005-010431, a fluorene bisphenol novolac resin disclosed in Japanese Patent Laid-Open Publication No. 2005-128509, an acenaphthylene copolymer disclosed in Japanese Patent Laid-Open Publication No. 2005-250434, an indene copolymer disclosed in Japanese Patent Laid-Open Publication No. 2006-053543, a fullerene having a phenol group disclosed in Japanese Patent Laid-Open Publication No. 2006-227391, a bisphenol compound and a novolac resin thereof disclosed in Japanese Patent Laid-Open Publication No. 2006-259249, No. 2006-293298 and No. 2007-316282, a dibisphenol compound and a novolac resin thereof disclosed in Japanese Patent Laid-Open Publication No. 2006-259482, a novolac resin of an adamanthanephenol compound disclosed in Japanese Patent Laid-Open Publication No. 2006-285095, a hydroxyvinylnaphthalene copolymer disclosed in Japanese Patent Laid-Open Publication No. 2007-171895, a bisnaphthol compound and a novolac resin thereof disclosed in Japanese Patent Laid-Open Publication No. 2007-199653, ROMP (Ring-Opening Metathesis Polymer) disclosed in Japanese Patent Laid-Open Publication No. 2008-026600, and a tricyclopentadiene copolymerized material disclosed in Japanese Patent Laid-Open Publication No. 2008-096684.

Among these materials, a material having a high n value is a material in which a content of an aromatic group is low and a ratio of an alicyclic group is high. For example, a resin containing dicyclopentadiene, tricyclopentadiene, acenaphthylene, adamanthane, ROMP and/or a nortricyclene series material is more suitable than that of a novolac series material. These materials have a high n value, so that even when a film thickness of the silicon-oxidized film thereon is made thin as 20 nm or less, reflectance of the substrate can be suppressed to 1% or less.

In the process for forming a multi-layer film of the present invention, formation of the hydrocarbon film is preferably carried out by the spin coating method. Also, a film thickness of the hydrocarbon film is preferably made 5 to 100 nm, more preferably 10 to 80 nm.

[Step (4)]

In the step (4) of the process for forming a multi-layer film of the present invention, a silicon-oxidized film material is coated onto the hydrocarbon film formed as mentioned above to form a silicon-oxidized film.

(Silicon-Oxidized Film)

As the silicon-oxidized film material to be used in the process for forming a multi-layer film of the present invention, there may be mentioned a silsesquioxane type material having an absorption at the exposure wavelength as disclosed in Japanese Patent Laid-Open Publication No. 2007-302873.

In the process for forming a multi-layer film of the present invention, formation of the silicon-oxidized film is preferably carried out by the spin coating method. Also, a film thickness of the silicon-oxidized film is preferably made 10 to 20 nm.

A multi-layer film laminated in the order of the under layer film, the silicon film, the hydrocarbon film and the silicon-oxidized film onto the substrate can be formed by the process including the steps (1) to (4) as explained above.

When such a process for forming a multi-layer film is employed, a multi-layer film which can be suitably used as the resist under layer film in the lithography, and having optimum n value and k value, and embedding characteristics as the antireflection film, and having excellent etching resistance can be formed.

<Patterning Process>

The present invention provides a patterning process using the multi-layer film formed as mentioned above, which comprises the steps of:

(A) forming a photoresist film on a multi-layer film which has been formed on a substrate by the above-mentioned process for forming a multi-layer film,
(B) forming a photoresist pattern by subjecting to exposure and development to the photoresist film,
(C) transferring the pattern to the silicon-oxidized film by subjecting to dry etching using the photoresist pattern as a mask,
(D) transferring the pattern to the hydrocarbon film by subjecting to dry etching using the silicon-oxidized film to which the pattern has been transferred as a mask,
(E) transferring the pattern to the silicon film by subjecting to dry etching using the hydrocarbon film to which the pattern has been transferred as a mask, and
(F) transferring the pattern to the under layer film by subjecting to dry etching using the silicon film to which the pattern has been transferred as a mask.

In the following, one example (penta-layer (5 layers) process) of the patterning process of the present invention is explained by referring to FIG. 2, but the patterning process of the present invention is not limited by the example.

In the patterning process of FIG. 2, as the step (A), a photoresist film 7 is firstly formed onto the multi-layer film (a silicon-oxidized film 6 at the uppermost layer) formed on the substrate by the process for forming a multi-layer film mentioned above (FIG. 2(A)).

As the photoresist film 7, it may be either a positive type or a negative type, and the same material as the photoresist composition usually used may be used. Also, when a single layer photoresist film is to be formed by the photoresist composition, the spin coating method is preferably used similarly to the case where the under layer film, etc., are to be formed. After spin coating the photoresist composition, pre-baking is preferably carried out under the conditions of at 60 to 180° C. for 10 to 300 seconds. Incidentally, a thickness of the photoresist film is not particularly limited, and preferably made 30 to 500 nm, particularly preferably 50 to 400 nm.

Next, as the step (B), prescribed portions (exposed portions 8) of the photoresist film 7 are exposed (FIG. 2 (B-1)), and after subjecting to post exposure baking (PEB), development is carried out to form a photoresist pattern (FIG. 2 (B-2)). In the case of the positive pattern, as shown in FIG. 2, the exposed portions 8 are dissolved in the developing solution, and in the case of the negative pattern, unexposed portions are dissolved in the developing solution.

As the exposure light, there may be mentioned a high energy beam having a wavelength of 300 nm or less, more specifically, far ultraviolet rays, KrF excimer laser light (248 nm), ArF excimer laser light (193 nm), $F_2$ laser light (157 nm), $Kr_2$ laser light (146 nm), $Ar_2$ laser light (126 nm), soft X-ray (EUV (wavelength 13.5 nm), etc.) having 3 to 20 nm, electron beam (EB), X-ray, etc.

Next, as the step (C), dry etching is carried out using the photoresist pattern as a mask to transfer the pattern to the silicon-oxidized film 6 (FIG. 2(C)).

As the etching gas to be used in the step (C), a flon series gas is suitable.

Next, as the step (D), dry etching is carried out using the silicon-oxidized film 6 to which the pattern has been transferred as a mask to transfer the pattern to the hydrocarbon film 5 (FIG. 2(D)).

As the etching gas to be used in the step (D), one or more gases selected from an oxygen gas, a hydrogen gas, an ammonia gas, a carbon dioxide gas, a carbon monoxide gas and a sulfur dioxide gas is/are suitable.

Also, the dry etching of the step (D) may be an oxygen plasma etching.

Next, as the step (E), dry etching is carried out using the hydrocarbon film 5 to which the pattern has been transferred as a mask to transfer the pattern to the silicon film 4 (FIG. 2(E)).

As the etching gas to be used in the step (E), a gas containing bromine or chlorine is suitable.

Next, as the step (F), dry etching is carried out using the silicon film 4 to which the pattern has been transferred as a mask to transfer the pattern to the under layer film 3 (FIG. 2(F)).

As the etching gas to be used in the step (F), one or more gases selected from an oxygen gas, a hydrogen gas, an ammonia gas, a carbon dioxide gas, a carbon monoxide gas and a sulfur dioxide gas is/are suitable.

Further, as the step (G), dry etching is carried out using the silicon film 4 to which the pattern has been transferred and the under layer film 3 to which the pattern has been transferred as masks, whereby the pattern may be transferred to the layer to be processed 2 of the substrate 1 (FIG. 2(G)).

As the etching gas to be used in the step (G), when the layer to be processed 2 is $SiO_2$, SiN or a silica series low dielectric constant insulating film, an etching gas mainly comprising a flon series gas is suitable, and when the layer to be processed 2 is p-Si, Al or W, an etching gas mainly comprising a chlorine series or a bromine series gas is suitable.

Incidentally, in the present invention, the silicon film 4 and the under layer film 3 are films both having resistance to the etching gas of the layer to be processed 2.

When the patterning process of the present invention as explained above is employed, a pattern is formed with a 5 layer (penta-layer) process by using a photoresist film and a multi-layer film having optimum n value and k value, embedding characteristics as an antireflection film, and excellent etching resistance, so that, in particular, even when a negative tone resist pattern developed by an organic solvent which is thin and vulnerable in dry etching resistance is used, the pattern can be transferred with high accuracy.

EXAMPLES

In the following, the present invention is explained more specifically by referring to Examples and Comparative examples, but the present invention is not limited by these.

Incidentally, the molecular weight of the polymer shows a weight average molecular weight (Mw), a number average molecular weight (Mn), a molecular weight dispersity (Mw/Mn) in terms of the polystyrene by gel permeation chromatography (GPC).

Under layer film polymers 1 to 6 and Comparative under layer film polymer 1 used in the under layer film materials are shown below.

Under layer film polymer 1: Mw=3,500, Mw/Mn=4.50

Under layer film polymer 1

Under layer film polymer 2: Mw=3,100, Mw/Mn=4.80

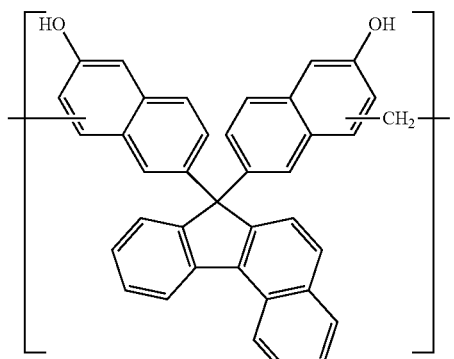

Under layer film polymer 2

Under layer film polymer 3: Mw=2,600, Mw/Mn=5.10

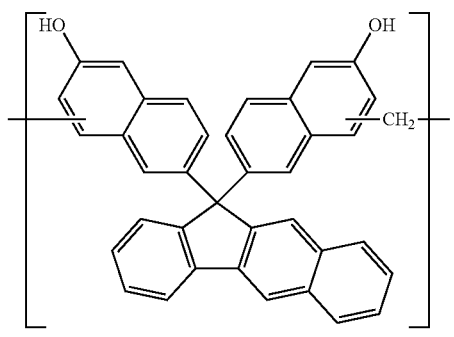

Under layer film polymer 3

Under layer film polymer 4: Mw=3,600, Mw/Mn=4.80

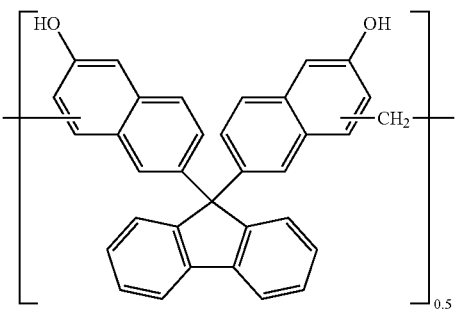

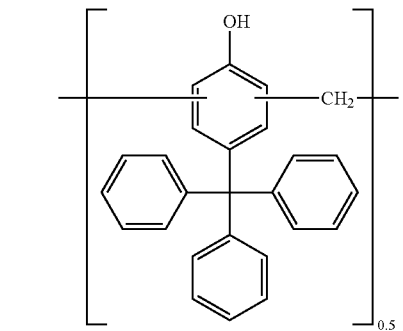

Under layer film polymer 4

Under layer film polymer 5: Mw=3,200, Mw/Mn=5.40

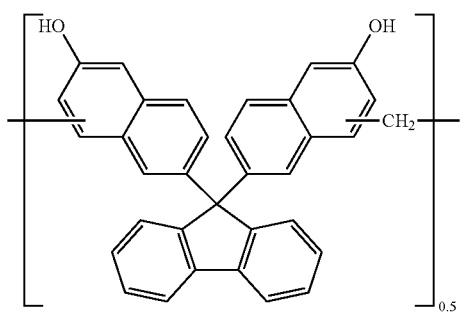

Under layer film polymer 5

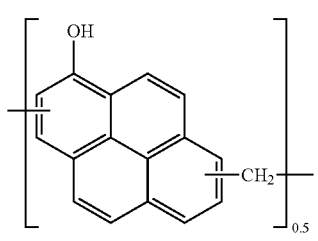

Under layer film polymer 6: Mw=6,200, Mw/Mn=6.40

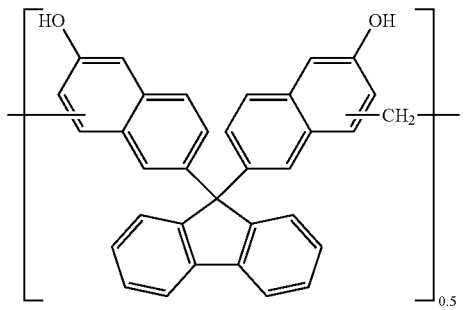

Comparative under layer film polymer 1: Mw=6,500, Mw/Mn=5.20

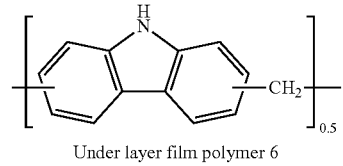

Comparative under layer film polymer 1

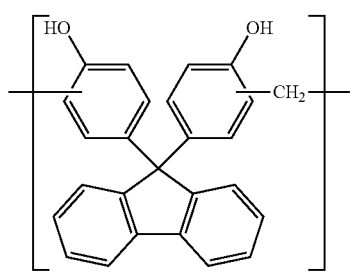

Hydrocarbon film polymers 1 to 4 used in the hydrocarbon film materials are shown below.

Hydrocarbon film polymer 1: Mw=6,900, Mw/Mn=1.88

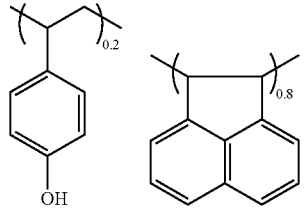

Hydrocarbon film polymer 1

Hydrocarbon film polymer 2: Mw=7,200, Mw/Mn=1.79

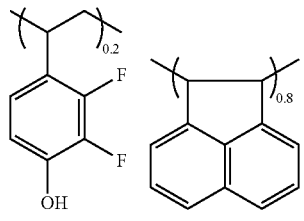

Hydrocarbon film polymer 2

Hydrocarbon film polymer 3: Mw=890, Mw/Mn=3.53

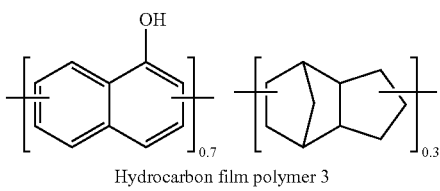

Hydrocarbon film polymer 3

Hydrocarbon film polymer 4: Mw=9,900, Mw/Mn=1.23

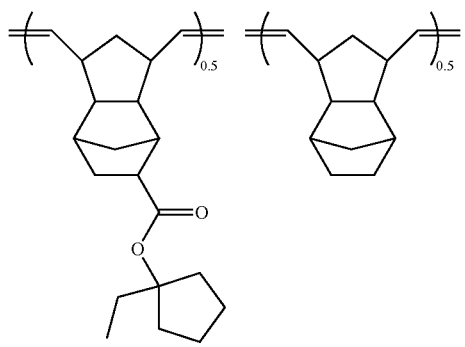

Hydrocarbon film polymer 4

Silicon-oxidized film polymer 1 used in the silicon-oxidized film material is shown below.

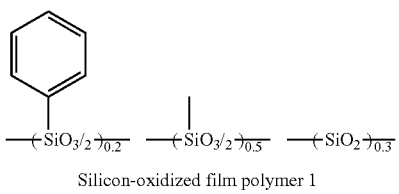

Silicon-oxidized film polymer 1

Acid generators AG1 and AG2, and Crosslinking agent CR1 used in the hydrocarbon film materials and the silicon-oxidized film materials are shown below.

AG1

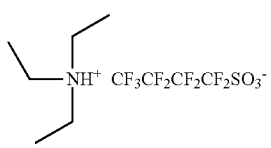

CR1

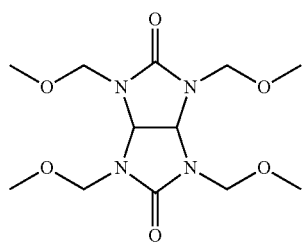

AG2

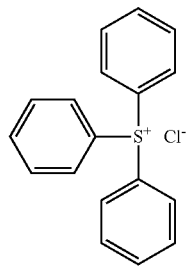

ArF resist polymer 1, Acid generator PAG1, Quencher and Water-repellent polymer 1 used in the photoresist film materials are shown below.

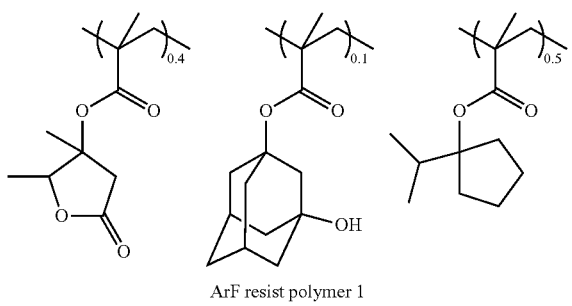

ArF resist polymer 1

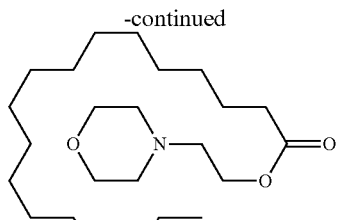

Quencher

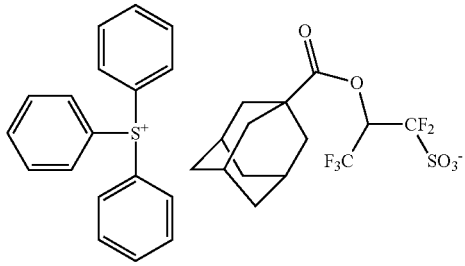

PAG1

Water-repellent polymer 1

In addition, the solvents used in the under layer film materials, the hydrocarbon film materials, the silicon-oxidized film materials and the photoresist film materials are shown below.

PGMEA: Propylene glycol monomethyl ether acetate
Cyclohexanone
Water
PGEE: Propylene glycol monoethyl ether
GBL: γ-butyrolactone Preparation of Under Layer Film Materials (UDL-1 to 6 and Comparative UDL-1)

The resins shown by the Under layer film polymers 1 to 6 and Comparative under layer film polymer 1 were each dissolved in a solvent containing 0.1% by mass of FC-4430 (available from Sumitomo 3M Ltd.) with the ratio shown in Table 1, and filtered through a filter made of a fluorine resin having a pore size of 0.1 μm to prepare under layer film materials (UDL-1 to 6 and comparative UDL-1).

TABLE 1

| Under layer film material | Polymer (parts by mass) | Solvent (parts by mass) |
|---|---|---|
| UDL-1 | Under layer film polymer 1 (10) | PGMEA (200) |
| UDL-2 | Under layer film polymer 2 (10) | PGMEA (100) Cyclohexanone (100) |
| UDL-3 | Under layer film polymer 3 (10) | PGMEA (100) Cyclohexanone (100) |
| UDL-4 | Under layer film polymer 4 (10) | PGMEA (100) Cyclohexanone (100) |

TABLE 1-continued

| Under layer film material | Polymer (parts by mass) | Solvent (parts by mass) |
|---|---|---|
| UDL-5 | Under layer film polymer 5 (10) | PGMEA (100) Cyclohexanone (100) |
| UDL-6 | Under layer film polymer 6 (10) | PGMEA (100) Cyclohexanone (100) |
| Comparative UDL-1 | Comparative under layer film polymer 1(10) | PGMEA (100) Cyclohexanone (100) |

Preparation of Hydrocarbon Film Materials (HCL-1 to 3)

The resins shown by the hydrocarbon film polymers 1 to 4, Acid generator AG1 and Crosslinking agent CR1 were dissolved in a solvent containing 0.1% by mass of FC-4430 (available from Sumitomo 3M Ltd.) with the ratio shown in Table 2, and filtered through a filter made of a fluorine resin having a pore size of 0.1 μm to prepare hydrocarbon film materials (HCL-1 to 3).

TABLE 2

| Hydrocarbon film material | Polymer (parts by mass) | Crosslinking agent (parts by mass) | Acid generator (part by mass) | Solvent (parts by mass) |
|---|---|---|---|---|
| HCL-1 | Hydrocarbon polymer 1 (5) Hydrocarbon polymer 3 (5) | CR1 (1) | AG1 (0.2) | PGMEA (400) |
| HCL-2 | Hydrocarbon polymer 2 (5) Hydrocarbon polymer 3 (5) | CR1 (1) | AG1 (0.2) | PGMEA (400) |
| HCL-3 | Hydrocarbon polymer 1 (5) Hydrocarbon polymer 4 (5) | — | — | PGMEA (200) Cyclohexanone (200) |

Preparation of Silicon-Oxidized Film Material (SOG-1)

The resin shown by the silicon-oxidized film polymer 1 and Acid generator AG2 were dissolved in a solvent containing 0.1% by mass of FC-4430 (available from Sumitomo 3M Ltd.) with the ratio shown in Table 3, and filtered through a filter made of a fluorine resin having a pore size of 0.1 μm to prepare Silicon-oxidized film material (SOG-1).

TABLE 3

| Silicon-oxidized film material | Polymer (parts by mass) | Acid generator (part by mass) | Solvent (parts by mass) |
|---|---|---|---|
| SOG-1 | Silicon-oxidized film polymer 1 (5) | AG2 (0.2) | PGEE (1000) Water (100) |

Preparation of Photoresist Film Material (ArF Resist 1)

The resin shown by the ArF resist polymer 1, Acid generator PAG1, Quencher and Water-repellent polymer 1 were dissolved in a solvent containing 0.1% by mass of FC-4430 (available from Sumitomo 3M Ltd.) with the ratio shown in Table 4, and filtered through a filter made of a fluorine resin having a pore size of 0.1 μm to prepare Photoresist film material (ArF resist 1).

TABLE 4

| Photoresist film material | Polymer (parts by mass) | Acid generator (parts by mass) | Quencher (parts by mass) | Water-repellent agent (parts by mass) | Solvent (parts by mass) |
|---|---|---|---|---|---|
| ArF resist 1 | ArF resist polymer 1 (100) | PAG1 (15.0) | Quencher (4.5) | Water-repellent polymer 1 (5.0) | PGMEA (3000) GBL (15) |

Measurements of Refractive Index of Under Layer Film and Film Thickness Before and after High Temperature Baking The under layer film materials (UDL-1 to 6 and Comparative UDL-1) were each coated onto the silicon substrate (wafer), baked at 350° C. for 60 seconds to form under layer films each having a film thickness of 100 nm, and a refractive index (n value and k value) at a wavelength of 193 nm and film thickness "a" after baking at 350° C. of each under layer film were measured by an incident angle variable spectroscopic ellipsometer (VASE; manufactured by J.A. Woollam Co., Inc.). Then, the wafer was baked in a furnace under nitrogen stream at 500° C. for 3 minutes, film thickness "b" after baking at 500° C. was measured, and a ratio of the film thicknesses before and after baking at 500° C. was obtained. The results are shown in Table 5.

TABLE 5

| Under layer film material | Film thickness "a" after baking at 350° C. (nm) | Refractive index n value | Refractive index k value | Film thickness "b" after baking at 500° C. (nm) | Ratio of film thicknesses before and after baking at 500° C. "b"/"a" × 100(%) |
|---|---|---|---|---|---|
| UDL-1 | 103 | 1.33 | 0.44 | 98 | 95 |
| UDL-2 | 105 | 1.32 | 0.46 | 101 | 96 |
| UDL-3 | 98 | 1.31 | 0.47 | 92 | 94 |
| UDL-4 | 103 | 1.33 | 0.46 | 96 | 93 |
| UDL-5 | 105 | 1.38 | 0.50 | 93 | 89 |
| UDL-6 | 106 | 1.37 | 0.48 | 91 | 86 |
| Comparative UDL-1 | 91 | 1.35 | 0.64 | 36 | 40 |

Measurement of Refractive Index of Hydrocarbon Film and Silicon-Oxidized Film

The hydrocarbon film materials (HCL-1 to 3) and the silicon-oxidized film material (SOG-1) were each coated onto the silicon substrate, baked at 200° C. for 60 seconds to form a hydrocarbon film with a film thickness of 40 nm and a silicon-oxidized film with a film thickness of 20 nm, and a refractive index (n value and k value) of each film at a wavelength of 193 nm was measured by an incident angle variable spectroscopic ellipsometer (VASE; manufactured by J.A. Woollam Co., Inc.). The results are shown in Table 6.

TABLE 6

| | Refractive index | |
|---|---|---|
| Film material | n value | k value |
| HCL-1 (Hydrocarbon film) | 1.50 | 0.30 |
| HCL-2 (Hydrocarbon film) | 1.55 | 0.28 |
| HCL-3 (Hydrocarbon film) | 1.61 | 0.31 |
| SOG-1 (Silicon-oxidized film) | 1.60 | 0.20 |

Pattern Etching Test
[Formation of Multi-Layer Film]

Examples 1 to 8 and Comparative Example 1

Each of the under layer film materials (UDL-1 to 6 and comparative UDL-1) shown in Table 1 was coated by spin coating on an Si wafer substrate having a diameter of 300 mm onto which a $SiO_2$ film (a layer to be processed) having a film thickness of 200 nm has been formed, and baked under atmosphere at 350° C. for 60 seconds to form an under layer film having a film thickness of 100 nm. Further, the material was baked in a furnace under nitrogen atmosphere at 500° C. for 3 minutes.

Next, a polysilicon film (silicon film) having a film thickness of 10 nm was formed by sputtering onto the substrate onto which the under layer film has been formed as mentioned above under the conditions as mentioned below.
(Sputtering Conditions)

| | |
|---|---|
| Target | Silicon |
| Sputtering gas | Argon |
| Chamber pressure | 0.5 Pa |
| RF Power | 1,000 W |
| Time | 120 sec |
| Substrate temperature | 550° C. |

Next, each of the hydrocarbon film materials (HCL-1 to 3) shown in Table 2 was coated by spin coating onto the substrate onto which the polysilicon film has been formed as mentioned above, and baked at 220° C. for 60 seconds to form a hydrocarbon film having a film thickness of 40 nm. Further, the silicon-oxidized film material (SOG-1) shown in Table 3 was coated thereon by spin coating, and baked at 200° C. for 60 seconds to form a silicon-oxidized film having a film thickness of 20 nm which was made a multi-layer film (4 layers).

Comparative Example 2

The under layer film material (UDL-1) shown in Table 1 was coated by spin coating on an Si wafer substrate having a diameter of 300 mm onto which a $SiO_2$ film (a layer to be processed) having a film thickness of 200 nm has been formed, and baked under atmosphere at 350° C. for 60 seconds to form an under layer film having a film thickness of 100 nm. In Comparative example 2, a silicon-oxidized film material (SOG-1) was coated on the under layer film by spin coating without forming the silicon film and the hydrocarbon film, and baked at 200° C. for 60 seconds to form a silicon-oxidized film having a film thickness of 20 nm which was made a multi-layer film (2 layers).
[Formation of Pattern]

The ArF resist shown in Table 4 was coated by spin coating onto each of the substrates of Examples 1 to 8 and Comparative examples 1 to 2 onto which the multi-layer film has been formed as mentioned above, and baked at 100° C. for 60 seconds to form a photoresist film having a film thickness of 70 nm, respectively. According to this procedure, Examples 1 to 8 and Comparative example 1 have formed a structure of a penta-layer (5 layers) and Comparative example 2 have formed a structure of a tri-layer (3 layers).

These were exposed by using an ArF excimer laser liquid immersion scanner (NSR-610C; manufactured by Nikon Corporation, NA=1.30, ρ=0.98/0.78, dipole opening 20°, Azimuthally polarized illumination, 6% halftone phase shift mask) while changing an exposure dose, and after the exposure, baked (PEB) at 80° C. for 60 seconds, developed by 2.38% by mass of an aqueous tetramethyl ammonium hydroxide (TMAH) solution for 30 seconds, rinsed by pure water and spin dried to form a line and space pattern with 40 nm.

Then, (a) dry etching was carried out by using the resist pattern formed as mentioned above as a mask to transfer the pattern to the silicon-oxidized film, (b) dry etching was carried out by using the obtained silicon-oxidized film pattern as a mask to transfer the pattern to the hydrocarbon film, (c) dry etching was carried out by using the obtained hydrocarbon film pattern as a mask to transfer the pattern to the polysilicon film, (d) dry etching was carried out by using the obtained polysilicon film pattern as a mask to transfer the pattern to the under layer film, and (e) dry etching was carried out by using the polysilicon film pattern and the obtained under layer film pattern as masks to transfer the pattern to the $SiO_2$ film, whereby the layer to be processed was processed.

Etching conditions are as shown below.
(a) Transfer (etching) conditions of resist pattern to silicon-oxidized film

| | |
|---|---|
| Chamber pressure | 10.0 Pa |
| RF power | 1,500 W |
| $CF_4$ gas flow amount | 75 ml/min |
| $O_2$ gas flow amount | 15 ml/min |
| Time | 12 sec |

(b) Transfer (etching) conditions of silicon-oxidized film pattern to hydrocarbon film

| | |
|---|---|
| Chamber pressure | 2.0 Pa |
| RF power | 500 W |
| Ar gas flow amount | 75 ml/min |
| $O_2$ gas flow amount | 45 ml/min |
| Time | 30 sec |

(c) Transfer (etching) conditions of hydrocarbon film pattern to polysilicon film

| | |
|---|---|
| Chamber pressure | 40.0 Pa |
| RF power | 300 W |
| $Cl_2$ gas flow amount | 30 ml/min |
| $BCl_3$ gas flow amount | 30 ml/min |
| $CHF_3$ gas flow amount | 100 ml/min |
| $O_2$ gas flow amount | 2 ml/min |
| Time | 30 sec |

(d) Transfer (etching) conditions of polysilicon film pattern to under layer film

| | |
|---|---|
| Chamber pressure | 2.0 Pa |
| RF power | 500 W |
| Ar gas flow amount | 75 ml/min |
| $O_2$ gas flow amount | 45 ml/min |
| Time | 100 sec |

(e) Transfer (etching) conditions of polysilicon film and under layer film pattern to $SiO_2$ film

| | |
|---|---|
| Chamber pressure | 2.0 Pa |
| RF power | 2,200 W |

-continued

| | |
|---|---|
| $C_5F_{12}$ gas flow amount | 20 ml/min |
| $C_2F_6$ gas flow amount | 10 ml/min |
| Ar gas flow amount | 300 ml/min |
| $O_2$ gas flow amount | 60 ml/min |
| Time | 90 sec |

Incidentally, in Comparative example 2, after subjecting transfer of the resist pattern to the silicon-oxidized film under the condition (a), transfer of the silicon-oxidized film pattern to the under layer film was carried out under the condition (d), and transfer of the under layer film pattern to the $SiO_2$ film was carried out under the condition (e), whereby the layer to be processed was processed.

Pattern cross sectional surfaces of the substrates of Examples 1 to 8 and Comparative examples 1 to 2 in which the layers to be processed had been processed as mentioned above were observed by an electron microscope (S-4700; manufactured by Hitachi, Ltd.), and their shapes were compared. The results are shown in Table 7.

TABLE 7

| | Under layer film | Silicon film | Hydrocarbon film | Silicon-oxidized film | Photoresist film | Pattern shape after transfer etching to substrate |
|---|---|---|---|---|---|---|
| Example 1 | UDL-1 | Present | HCL-1 | SOG-1 | ArF resist-1 | Rectangular |
| Example 2 | UDL-2 | Present | HCL-1 | SOG-1 | ArF resist-1 | Rectangular |
| Example 3 | UDL-3 | Present | HCL-1 | SOG-1 | ArF resist-1 | Rectangular |
| Example 4 | UDL-4 | Present | HCL-1 | SOG-1 | ArF resist-1 | Rectangular |
| Example 5 | UDL-5 | Present | HCL-1 | SOG-1 | ArF resist-1 | Rectangular |
| Example 6 | UDL-6 | Present | HCL-1 | SOG-1 | ArF resist-1 | Rectangular |
| Example 7 | UDL-1 | Present | HCL-2 | SOG-1 | ArF resist-1 | Rectangular |
| Example 8 | UDL-1 | Present | HCL-3 | SOG-1 | ArF resist-1 | Rectangular |
| Comparative example 1 | Comparative UDL-1 | Present | HCL-1 | SOG-1 | ArF resist-1 | Tapered shape |
| Comparative example 2 | UDL-1 | None | None | SOG-1 | ArF resist-1 | Pattern collapse |

As shown in Table 7, in Examples 1 to 8 in which the pattern has been formed by the penta-layer process using the multi-layer film formed by the process for forming a multi-layer film of the present invention as a resist under layer film, a pattern having a sectional shape of rectangular could be obtained.

In Examples 1 to 8, as shown in Table 5, a silicon film such as a polysilicon film is formed on the under layer film which is less loss quantity even when it is baked at a high temperature of 500° C., and the hydrocarbon film and the silicon-oxidized film having refractive indexes (antireflection effect) as shown in Table 6 are formed thereon. According to this constitution, light is totally reflected on the polysilicon film, substrate reflection can be reduced by two layers of the antireflection films of the hydrocarbon film and the silicon-oxidized film thereon, and substrate reflection can be suppressed even when the film thickness of the silicon-oxidized film just below the resist is made thin, so that the resist pattern can be smoothly transferred by dry etching to the silicon-oxidized film. Due to excellent dry etching resistance of the polysilicon film, the shape of the pattern of the substrate to be processed as the base material after subjected to dry etching becomes good.

On the other hand, in Comparative example 1 in which Comparative UDL-1 was used as the under layer film material, a sectional shape of the pattern was tapered as shown in Table 7. Also, in Comparative example 2 in which neither the silicon film nor the hydrocarbon film had been formed (tri-layer process), pattern collapse was occurred as shown in Table 7.

From the results as mentioned above, when formation of the pattern is carried out by the penta-layer process using the multi-layer film formed by the process for forming a multi-layer film of the present invention, it is excellent in antireflection effect than the conventional tri-layer process, and excellent in selectivity of dry etching, so that a pattern with good shape can be formed.

It must be stated here that the present invention is not restricted to the embodiments shown by the embodiments. The embodiments are merely examples so that any embodiments composed of substantially the same technical concept as disclosed in the claims of the present invention and expressing a similar effect are included in the technical scope of the present invention.

What is claimed is:

1. A process for forming a multi-layer film comprising the steps of:
   (1) forming an under layer film onto a substrate by coating an under layer film material containing a resin represented by the following general formula (1) in which a compound having a bisnaphthol group has been made a novolac resin, and curing the same by heat treatment at a temperature in a range of 300° C. or higher and 700° C. or lower for 10 seconds to 600 seconds,
   (2) forming a silicon film onto the under layer film,
   (3) forming a hydrocarbon film onto the silicon film by coating a hydrocarbon film material, and
   (4) forming a silicon-oxidized film onto the hydrocarbon film by coating a silicon-oxidized film material,
   coating of the materials in the step (1), the step (3), and the step (4) being carried out by a spin coating method.

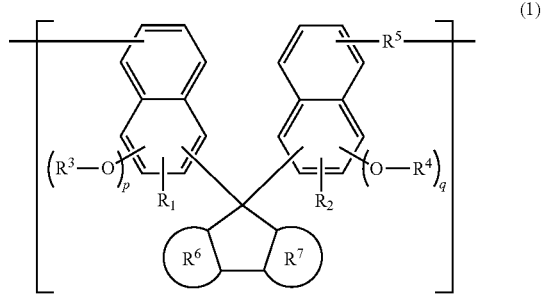

(1)

wherein $R^1$ and $R^2$ each independently represent a hydrogen atom, a linear, branched or cyclic alkyl group having 1 to 10 carbon atoms, an aryl group having 6 to 20 carbon atoms or an alkenyl group having 2 to 20 carbon atoms; $R^3$ and $R^4$ each independently represent a hydrogen atom or a glycidyl group; $R^5$ represents a linear or branched alkylene group having 1 to 10 carbon atoms; $R^6$ and $R^7$ each independently represent a benzene ring or a naphthalene ring, and a hydrogen atom(s) in the benzene ring or the naphthalene ring may be substituted by a hydrocarbon group having 1 to 6 carbon atoms; and "p" and "q" each independently represent 1 or 2.

2. The process for forming a multi-layer film according to claim 1, wherein the step (2) is carried out by a sputtering method or a vapor phase epitaxial growth method.

3. The process for forming a multi-layer film according to claim 2, wherein the under layer film having a film thickness of 30 to 20,000 nm is formed in the step (1), the silicon film having a film thickness of 3 to 100 nm is formed in the step (2), the hydrocarbon film having a film thickness of 5 to 100 nm is formed in the step (3), and the silicon-oxidized film having a film thickness of 10 to 20 nm is formed in the step (4).

4. The process for forming a multi-layer film according to claim 1, wherein the under layer film having a film thickness of 30 to 20,000 nm is formed in the step (1), the silicon film having a film thickness of 3 to 100 nm is formed in the step (2), the hydrocarbon film having a film thickness of 5 to 100 nm is formed in the step (3), and the silicon-oxidized film having a film thickness of 10 to 20 nm is formed in the step (4).

5. A patterning process which comprises the steps of:
(A) forming a photoresist film on a multi-layer film which has been formed on a substrate by the process for forming a multi-layer film according to claim 1,
(B) forming a photoresist pattern by subjecting to exposure and development to the photoresist film,
(C) transferring the pattern to the silicon-oxidized film by subjecting to dry etching using the photoresist pattern as a mask,
(D) transferring the pattern to the hydrocarbon film by subjecting to dry etching using the silicon-oxidized film to which the pattern has been transferred as a mask,
(E) transferring the pattern to the silicon film by subjecting to dry etching using the hydrocarbon film to which the pattern has been transferred as a mask, and
(F) transferring the pattern to the under layer film by subjecting to dry etching using the silicon film to which the pattern has been transferred as a mask.

6. The patterning process according to claim 5, wherein the dry etching in the step (F) is carried out by using one or more etching gases selected from an oxygen gas, a hydrogen gas, an ammonia gas, a carbon dioxide gas, a carbon monoxide gas and a sulfur dioxide gas.

7. A patterning process which comprises the steps of:
(A) forming a photoresist film on a multi-layer film which has been formed on a substrate by the process for forming a multi-layer film according to claim 2,
(B) forming a photoresist pattern by subjecting to exposure and development to the photoresist film,
(C) transferring the pattern to the silicon-oxidized film by subjecting to dry etching using the photoresist pattern as a mask,
(D) transferring the pattern to the hydrocarbon film by subjecting to dry etching using the silicon-oxidized film to which the pattern has been transferred as a mask,
(E) transferring the pattern to the silicon film by subjecting to dry etching using the hydrocarbon film to which the pattern has been transferred as a mask, and
(F) transferring the pattern to the under layer film by subjecting to dry etching using the silicon film to which the pattern has been transferred as a mask.

8. The patterning process according to claim 7, wherein the dry etching in the step (F) is carried out by using one or more etching gases selected from an oxygen gas, a hydrogen gas, an ammonia gas, a carbon dioxide gas, a carbon monoxide gas and a sulfur dioxide gas.

9. A patterning process which comprises the steps of:
(A) forming a photoresist film on a multi-layer film which has been formed on a substrate by the process for forming a multi-layer film according to claim 4,
(B) forming a photoresist pattern by subjecting to exposure and development to the photoresist film,
(C) transferring the pattern to the silicon-oxidized film by subjecting to dry etching using the photoresist pattern as a mask,
(D) transferring the pattern to the hydrocarbon film by subjecting to dry etching using the silicon-oxidized film to which the pattern has been transferred as a mask,
(E) transferring the pattern to the silicon film by subjecting to dry etching using the hydrocarbon film to which the pattern has been transferred as a mask, and
(F) transferring the pattern to the under layer film by subjecting to dry etching using the silicon film to which the pattern has been transferred as a mask.

10. The patterning process according to claim 9, wherein the dry etching in the step (F) is carried out by using one or more etching gases selected from an oxygen gas, a hydrogen gas, an ammonia gas, a carbon dioxide gas, a carbon monoxide gas and a sulfur dioxide gas.

11. A patterning process which comprises the steps of:
(A) forming a photoresist film on a multi-layer film which has been formed on a substrate by the process for forming a multi-layer film according to claim 3,
(B) forming a photoresist pattern by subjecting to exposure and development to the photoresist film,
(C) transferring the pattern to the silicon-oxidized film by subjecting to dry etching using the photoresist pattern as a mask,
(D) transferring the pattern to the hydrocarbon film by subjecting to dry etching using the silicon-oxidized film to which the pattern has been transferred as a mask,
(E) transferring the pattern to the silicon film by subjecting to dry etching using the hydrocarbon film to which the pattern has been transferred as a mask, and
(F) transferring the pattern to the under layer film by subjecting to dry etching using the silicon film to which the pattern has been transferred as a mask.

* * * * *